US011453685B2

(12) United States Patent
Wei et al.

(10) Patent No.: US 11,453,685 B2
(45) Date of Patent: Sep. 27, 2022

(54) DIBENZOHETEROCYCLIC COMPOUND AND PREPARATION METHOD AND APPLICATION THEREOF

(71) Applicant: NINGBO LUMILAN ADVANCED MATERIALS CO., LTD., Ningbo (CN)

(72) Inventors: Ting-Wei Wei, Ningbo (CN); Huanda Ding, Ningbo (CN); Xiaoxiao Zhang, Ningbo (CN); Zhi-Kuan Chen, Ningbo (CN)

(73) Assignee: NINGBO LUMILAN ADVANCED MATERIALS CO., LTD., Ningbo (CN)

( * ) Notice: Subject to any disclaimer, the term of this patent is extended or adjusted under 35 U.S.C. 154(b) by 614 days.

(21) Appl. No.: 16/431,947

(22) Filed: Jun. 5, 2019

(65) Prior Publication Data
US 2020/0385412 A1 Dec. 10, 2020

(30) Foreign Application Priority Data
Jan. 29, 2019 (CN) .......................... 201910088838.3

(51) Int. Cl.
*H01L 51/54* (2006.01)
*C07F 7/08* (2006.01)
*H01L 51/00* (2006.01)
*H01L 51/50* (2006.01)

(52) U.S. Cl.
CPC .......... *C07F 7/0816* (2013.01); *C07F 7/0807* (2013.01); *H01L 51/0094* (2013.01); *H01L 51/5012* (2013.01); *H01L 51/006* (2013.01); *H01L 51/0061* (2013.01); *H01L 51/0067* (2013.01); *H01L 51/0072* (2013.01); *H01L 51/0073* (2013.01); *H01L 51/0074* (2013.01)

(58) Field of Classification Search
None
See application file for complete search history.

(56) References Cited

U.S. PATENT DOCUMENTS

| 2018/0114929 | A1* | 4/2018 | Kwong | .................. | C09K 11/02 |
| 2018/0175306 | A1 | 6/2018 | Dyatkin et al. | | |
| 2018/0366647 | A1* | 12/2018 | Jun | ....................... | H01L 51/006 |
| 2019/0071458 | A1* | 3/2019 | Jun | ....................... | C07F 7/0816 |

FOREIGN PATENT DOCUMENTS

| CN | 109096125 A | 12/2018 |
| JP | 2010202616 A | 9/2010 |
| TW | 201125953 A | 8/2011 |
| WO | 2011055912 A1 | 5/2011 |

OTHER PUBLICATIONS

C.W. Tang et al., "Organic Electroluminescent Diodes," Applied Physics Letters, 51, pp. 913-915, Sep. 21, 1987.
M.A. Baldo et al., "Excitonic Singlet-Triplet Ration in a Semiconducting Organic Thin Film," Physical Review B, vol. 60, No. 20, p. 14 422-14 428, Nov. 15, 1999.
Hiroki Uoyama, et al., "Highly Efficient Organic Light-Emitting Diodes from Delayed Fluorescence," Nature, vol. 492, pp. 234-240, Dec. 13, 2012.
First Office Action CN Application No. 2019100888383, issued in corresponding application dated Dec. 9, 2019.
CN International Search Report & Written Opinion in corresponding application No. 2019100888383 dated Oct. 31, 2019 (English translation of Written Opinion).
STNext Registry (Notes).
L.G. Mercier et al., "Design, Synthesis, and Characterization of Functionalized Silepins: High Quantum Yield Blue Emitters," Organometallics, ACS Publications, vol. 30, pp. 1719-1729, 2011.
J.Y. Corey, et al., "Synthesis of Dibenzo [b, f]Silpens*", Journal of Organometallic Chemistry, vol. 26 pp. 167-173, 1971.
Second Office Action of Chinese Application No. 2019100888383, issued in corresponding application dated Jul. 30, 2020.

* cited by examiner

*Primary Examiner* — Andrew K Bohaty
(74) *Attorney, Agent, or Firm* — Miles & Stockbridge P.C.; Ajay A. Jagtiani

(57) ABSTRACT

A dibenzoheterocyclic compound wherein band gaps of HOMO and LUMO energy levels of the dibenzoheterocyclic compound are wide, light can be emitted in a deep blue light-emitting region; and the LUMO energy level of the dibenzoheterocyclic compound is low, so the LUMO energy level matches with an electron transport layer for electrons injection and transport. The dibenzoheterocyclic compound has hole transport performance, so as a light-emitting layer material, the dibenzoheterocyclic compound balances the ratio of electrons to holes in a light-emitting layer increasing the combination probability and improving the device light-emitting efficiency. The spatial configuration of the dibenzoheterocyclic compound avoids material stacking molecules, reduces annihilation of excitons, and inhibits efficiency roll-off. The dibenzoheterocyclic compound has thermal stability, so deep blue light can be emitted efficiently and stably. With an organic light-emitting diode and a deep blue light-emitting device with high light-emitting efficiency, low working voltage can be obtained.

10 Claims, 3 Drawing Sheets

DIBENZOHETEROCYCLIC COMPOUND AND PREPARATION METHOD AND APPLICATION THEREOF

BACKGROUND

Technical Field

The invention relates to the field of organic electroluminescent materials, and particularly relates to a dibenzoheterocyclic compound, and a preparation method and application thereof.

Related Art

Owing to the advantages of low driving voltage, high light-emitting efficiency, high contrast ratio, high color saturation, low energy consumption, active light emitting, wide viewing angle, and high response speed, the organic light-emitting diodes (OLEDs) have attracted much interest over the past decades owing to their enormous potential application in the fields of display and illumination.

In 1987, the OLED with a multi-layer structure prepared by vacuum deposition coating was reported by Tang et al. in the Kodak Company. In the OLEDs, tin indium oxide (ITO) was used as a cathode, an aromatic amine derivative and tris(8-hydroxyquinoline)aluminum were sequentially coated on the cathode by evaporation, and a magnesium-silver alloy was used as an anode, so a green light-emitting device with high brightness (1000 cd/m$^2$) was obtained. Meanwhile, by optimizing the device, a hole transport layer formed by the aromatic amine derivative was additionally arranged, the device showed higher light-emitting brightness and light-emitting efficiency, and the driving voltage was lowered to below 10 V. Since then, the research of organic electroluminescent materials has attracted the attention of scientists from all over the world and become a research hotspot in academia and industry.

Fluorescent materials are the first generation of OLED materials. However, the devices based on the materials obtain low efficiency and only utilize 25% of singlet excitons and 75% of triplet excitons return to the ground state in the form of non-radiative deactivation due to spin-inhibition, thereby limiting the efficiency of the devices to a great extent. Until 1998, Baldo et al. firstly reported that by introducing metals such as iridium (III), platinum (II) and osmium (II) into organic small molecules to form a complex, the phosphorescent emitting materials utilize both singlet and triplet excited states for light emission and can show four times higher quantum efficiency than fluorescent emitting materials. Therefore, almost 100% internal quantum efficiency was achieved in red, green and blue phosphorescent OLEDs. In 2012, the Professor Chihaya Adachi of Kyushu University discovered a TADF material with a small singlet-triplet energy level difference ($\Delta E_{ST}$), the TADF emitting materials emit light from singlet excited state, but triplet state can be converted to singlet state by reverse intersystem crossing from triplet state to singlet state. Therefore, both singlet and triplet excited states contribute to light emission from singlet state and 100% internal quantum efficiency can be realized using the TADF materials theoretically.

At present, the development of phosphorescent materials and TADF materials ensures that red and green light-emitting materials can meet the light-emitting performance requirements of the OLEDs. However, due to a shorter wavelength of an absorption spectrum and a wide band gap between LUMO and HOMO, the blue emitting materials require more energy for radiation luminescence, thereby limiting the efficiency of the blue OLEDs. The types of blue light-emitting materials with high light-emitting efficiency are few, and light-emitting regions with blue-green light-emitting color difficultly emit deep blue light. The blue emitting materials mainly include planar aromatic ring molecules with simple conjugated fragments, and the blue emitting materials have low thermal stability and easily decompose under heat during film formation and application, so the efficiency and the lifetime of the devices are influenced. Meanwhile, the planar aromatic ring molecules are mutually stacked, excimers are easily formed, and the energy of the excitons is increased to cause annihilation, so the low efficiency and lifetime of the devices are reduced, and the emitting color is changed.

SUMMARY

Therefore, the invention aims to solve the technical problems and overcome the defects of the blue light-emitting materials, including poor thermal stability, excitons annihilation, low light-emitting efficiency, poor lifetime, and difficulty in deep blue light emission.

Therefore, the invention provides the following technical scheme:

Firstly, the invention is directed to a dibenzoheterocyclic compound, having a structure as shown in the formula (I):

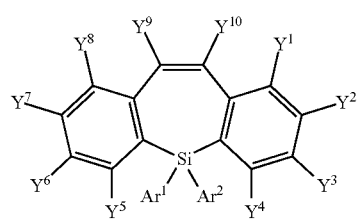

(I)

where $Ar^1$ and $Ar^2$ are, each independently, selected from substituted or unsubstituted $C_4$-$C_{60}$ aryl group and substituted or unsubstituted $C_3$-$C_{60}$ heteroaryl group, or $Ar^1$ and $Ar^2$ are bonded to form a ring A having a structure shown in the formula ($I_a$);

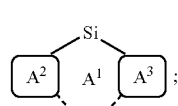

($I_a$)

the ring A includes a ring $A^1$ containing a silicon atom, and a ring $A^2$ and a ring $A^3$ which are condensed with the ring $A^1$ at any position; the ring $A^2$ and the ring $A^3$ are, each independently, selected from substituted or unsubstituted $C_4$-$C_{60}$ aryl group and substituted or unsubstituted $C_3$-$C_{60}$ heteroaryl group, and the ring A is a three-membered to seven-membered saturated or partially unsaturated heterocyclic ring;

$Y^1$-$Y^{10}$ are, each independently, selected from hydrogen, halogen, cyano group, substituted or unsubstituted $C_1$-$C_{60}$ alkyl group, substituted or unsubstituted $C_1$-$C_{60}$ alkenyl group, substituted or unsubstituted $C_1$-$C_{60}$ alkynyl group, substituted or unsubstituted $C_1$-$C_{60}$ alkylamino group, substituted or unsubstituted $C_1$-$C_{60}$ alkenylamino group, substituted or unsubstituted $C_1$-$C_{60}$ alkynylamino group, substituted or unsubstituted $C_1$-$C_{60}$ alkoxy group, substituted or unsubstituted $C_1$-$C_{60}$ alkenyloxy group, substituted or unsubstituted $C_1$-$C_{60}$ alkynyloxy group, substituted or unsubstituted $C_1$-$C_{60}$ thioalkoxy group, substituted or unsubstituted $C_1$-$C_{60}$ thioalkenyloxy group, substituted or unsubstituted $C_1$-$C_{60}$ thioalkynyloxy group, substituted or unsubstituted $C_1$-$C_{60}$ alkylboryl group, substituted or unsubstituted $C_1$-$C_{60}$ alkenylboryl group, substituted or unsubstituted $C_1$-$C_{60}$ alkynylboryl group, substituted or unsubstituted $C_1$-$C_{60}$ ester group, substituted or unsubstituted $C_1$-$C_{60}$ amide group, substituted or unsubstituted $C_4$-$C_{60}$ aryl group, substituted or unsubstituted $C_3$-$C_{60}$ heteroaryl group, substituted or unsubstituted $C_4$-$C_{60}$ aryloxy group, substituted or unsubstituted $C_4$-$C_{60}$ aromatic amino group, substituted or unsubstituted $C_4$-$C_{60}$ thioaryloxy group, and substituted or unsubstituted $C_4$-$C_{60}$ arylboryl group, or any two adjacent groups in $Y^1$-$Y^{10}$ are bonded to form a ring B, and the ring B is selected from three-membered to seven-membered saturated or partially unsaturated carbocyclic ring, three-membered to seven-membered saturated or partially unsaturated heterocyclic ring, $C_4$-$C_{60}$ aryl group, or $C_3$-$C_{60}$ heteroaryl group.

Preferably, in the dibenzoheterocyclic compound, the $Ar^1$ and the $Ar^2$ are, each independently, selected from substituted or unsubstituted $C_4$-$C_{30}$ monocyclic aryl group, substituted or unsubstituted $C_3$-$C_{30}$ condensed ring aryl group, substituted or unsubstituted $C_3$-$C_{30}$ monocyclic heteroaryl group, and substituted or unsubstituted $C_3$-$C_{30}$ condensed ring heteroaryl group, or the $Ar^1$ and the $Ar^2$ are bonded to form a ring A; in the ring A, the ring $A^2$ and the ring $A^3$ are, each independently, selected from substituted or unsubstituted $C_3$-$C_{30}$ condensed ring aryl group and substituted or unsubstituted $C_3$-$C_{30}$ condensed ring heteroaryl group;

the $Y^1$-$Y^{10}$ are, each independently, selected from hydrogen, cyano group, substituted or unsubstituted $C_4$-$C_{30}$ monocyclic aryl group, substituted or unsubstituted $C_3$-$C_{30}$ condensed ring aryl group, substituted or unsubstituted $C_3$-$C_{30}$ monocyclic heteroaryl group, substituted or unsubstituted $C_3$-$C_{30}$ condensed ring heteroaryl group, substituted or unsubstituted $C_4$-$C_{30}$ aromatic amino group, and substituted or unsubstituted $C_4$-$C_{30}$ arylboryl group, or any two adjacent groups in $Y^1$-$Y^{10}$ are bonded to form a ring B.

Preferably, in the dibenzoheterocyclic compound, the ring B is selected from at least one of a ring $B^1$ formed by $Y^9$ and $Y^{10}$, a ring $B^2$ formed by $Y^{10}$ and $Y^1$, a ring $B^3$ formed by $Y^2$ and $Y^1$, a ring $B^4$ formed by $Y^2$ and $Y^3$, a ring $B^5$ formed by $Y^4$ and $Y^3$, a ring $B^6$ formed by $Y^5$ and $Y^6$, a ring $B^7$ formed by $Y^6$ and $Y^7$, a ring $B^8$ formed by $Y^7$ and $Y^8$, a ring $B^9$ formed by $Y^8$ and $Y^9$, and a ring $B^{10}$ formed by condensing at least two of the ring $B^1$ to the ring $B^9$;

the $Ar^1$ to the $Ar^2$, the ring A to the ring $A^2$, and the ring $B^1$ to the ring $B^{10}$ are, each independently, selected from the following substituted or unsubstituted groups: three-membered to seven-membered saturated or partially unsaturated carbocyclic ring, three-membered to seven-membered saturated or partially unsaturated heterocyclic ring, biphenyl ring, terphenyl ring, pentalene ring, indene ring, naphthalene ring, azulene ring, heptalene ring, adamantane ring, corannulene ring, triphenylene ring, indacene ring, acenaphthene ring, fluorene ring, spirobifluorene ring, benzfluorene ring, dibenzofluorene ring, phenalene ring, phenanthrene ring, anthracene ring, fluoranthene ring, benzophenanthrene ring, pyrene ring, chrysene ring, naphthacene ring, picene ring, perylene ring, pentaphene ring, pentacene ring, rubicene ring, coronene ring, ovalene ring, pyridine ring, pyrazine ring, pyrimidine ring, pyridazine ring, triazine ring, thiophene ring, furan ring, quinoline ring, carbazole ring, pyranoid ring, thiapyran ring, phthalazine ring, phenazine ring, pyrrole ring, pyrazole ring, imidazole ring, oxazole ring, thiazole ring, indole ring, indolocarbazole ring, phenanthridine ring, acridine ring, perimidine ring, pteridine ring, quinazoline ring, quinoxaline ring, cinnoline ring, phenanthroline ring, carboline ring, benzofuran ring, benzothiophene ring, dibenzofuran ring, dibenzothiophene ring, benzonaphthofuran ring, dinaphthofuran ring, benzocarbazole ring, dibenzocarbazole ring, dibenzosilole ring, benzonaphthosilole ring, dinaphthosilole ring, benzimidazole ring, imidazopyridine ring, or condensed ring, spiro ring or chain ring formed by groups from the above groups;

the three-membered to seven-membered saturated or partially unsaturated heterocyclic ring has at least one heteroatom independently selected from N, O, S, or B.

Preferably, in the dibenzoheterocyclic compound, the $Y^1$-$Y^{10}$ are, each independently, selected from hydrogen and the following substituted or unsubstituted groups:

phenyl group, biphenyl group, terphenyl group, pentalene group, indenyl group, naphthyl group, azulene group, heptalene group, adamantane group, corannulene group, triphenylene group, indacene group, acenaphthenyl group, fluorenyl group, spirobifluorene group, benzfluorene group, dibenzofluorenyl group, phenalene group, phenanthryl group, anthryl group, fluoranthene group, benzophenanthrene group, pyrenyl group, chrysenyl group, naphthacene group, picene group, perylene group, pentaphene group, pentacene group, rubicene group, coronene group, ovalene group, pyridyl group, pyrazinyl group, pyrimidinyl group, pyridazinyl group, triazinyl group, thienyl group, furanyl group, quinolyl group, carbazolyl group, pyranyl group, thiapyran group, phthalazinyl group, phenazinyl group, pyrrolyl group, pyrazolyl group, imidazolyl group, oxazolyl group, thiazolyl group, indolyl group, indolocarbazole group, phenanthridinyl group, acridinyl group, perimidine group, pteridinyl group, quinazolinyl group, quinoxalinyl group, cinnoline group, phenanthroline group, carboline group, benzofuranyl group, benzothiophene group, dibenzofuran group, dibenzothiophene group, benzonaphthofuran group, dinaphthofuran group, benzocarbazole group, dibenzocarbazole group, dibenzosilole group, benzonaphthosilole group, dinaphthosilole group, benzimidazolyl group, imidazopyridine group,

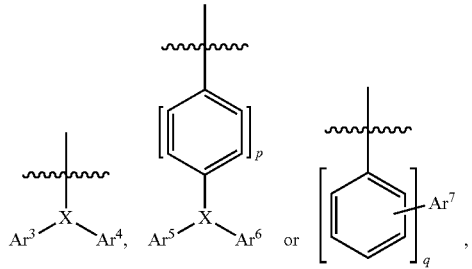

and condensed ring group, spiro ring group or chain ring group formed by groups from the above groups, where X is selected from N or B, p is an integer from 1 to 5, q is an integer from 1 to 5, and $Ar^3$-$Ar^7$ are, each independently, selected from hydrogen and the following substituted or unsubstituted groups: phenyl group, biphenyl group, terphenyl group, pentalene group, indenyl group, naphthyl group, azulene group, heptalene group, adamantane group, corannulene group, triphenylene group, indacene group, acenaphthenyl group, fluorenyl group, spirobifluorene group, benzfluorene group, dibenzofluorenyl group, phenalene group, phenanthryl group, anthryl group, fluoranthene group, benzophenanthrene group, pyrenyl group, chrysenyl group, naphthacene group, picene group, perylene group, pentaphene group, pentacene group, rubicene group, coronene group, ovalene group, pyridyl group, pyrazinyl group, pyrimidinyl group, pyridazinyl group, triazinyl group, thienyl group, furanyl group, quinolyl group, carbazolyl group, pyranyl group, thiapyran group, phthalazinyl group, phenazinyl group, pyrrolyl group, pyrazolyl group, imidazolyl group, oxazolyl group, thiazolyl group, indolyl group, indolocarbazole group, phenanthridinyl group, acridinyl group, perimidine group, pteridinyl group, quinazolinyl group, quinoxalinyl group, cinnoline group, phenanthroline group, carboline group, benzofuranyl group, benzothiophene group, dibenzofuran group, dibenzothiophene group, benzonaphthofuran group, dinaphthofuran group, benzocarbazole group, dibenzocarbazole group, dibenzosilole group, benzonaphthosilole group, dinaphthosilole group, benzimidazolyl group, imidazopyridine group, or condensed ring group, spiro ring group or chain ring group formed by groups from the above groups.

Preferably, the dibenzoheterocyclic compound has a structure as shown below:

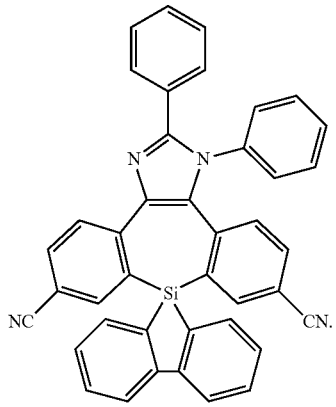

SA-45

Secondly, the invention is directed to a preparation method of the dibenzoheterocyclic compound.

Synthesis steps of the dibenzoheterocyclic compound shown in the formula (I) are as follows:

taking a compound shown in the formula (A) as a starting material, performing halogenating reaction under the action of a catalyst to obtain an intermediate 1, and enabling the intermediate 1 to react with triphenylphosphine to generate an intermediate 2; enabling the intermediate 2 and a compound shown in the formula (B) to be subjected to Wittig reaction to obtain an intermediate 3; enabling the intermediate 3 and a compound shown in the formula (C) to be subjected to condensation reaction to obtain an intermediate 4; enabling the intermediate 4 to react with a compound of at least one of $Y^1$-$Y^8$, a borate of at least one of $Y^1$-$Y^8$, or a cyclic compound forming any adjacent groups in $Y^1$-$Y^8$ to generate an intermediate 4-A;

when $Y^9$ and $Y^{10}$ are respectively hydrogen, determining that the intermediate 4-A is the dibenzoheterocyclic compound shown in the formula (I); and when at least one of $Y^9$ and $Y^{10}$ is not hydrogen, enabling the intermediate 4-A to be subjected to halogenating reaction or oxidation reaction to obtain an intermediate 5, and enabling the intermediate 5 to react with a compound of at least one of $Y^9$-$Y^{10}$ or a cyclic compound forming $Y^9$ and $Y^{10}$ to obtain the dibenzoheterocyclic compound shown in the formula (I), $X_1$-$X_3$ are, each independently, selected from halogen; ---- represents selection from a single bond or a double bond; when ---- is the single bond, $X_4$ is selected from halogen; when ==== is the double bond, $X_4$ is oxygen; and $R_1$-$R_8$ are, each independently, selected from halogen or hydrogen;

a synthesis route of the dibenzoheterocyclic compound shown in the formula (I) is as follows:

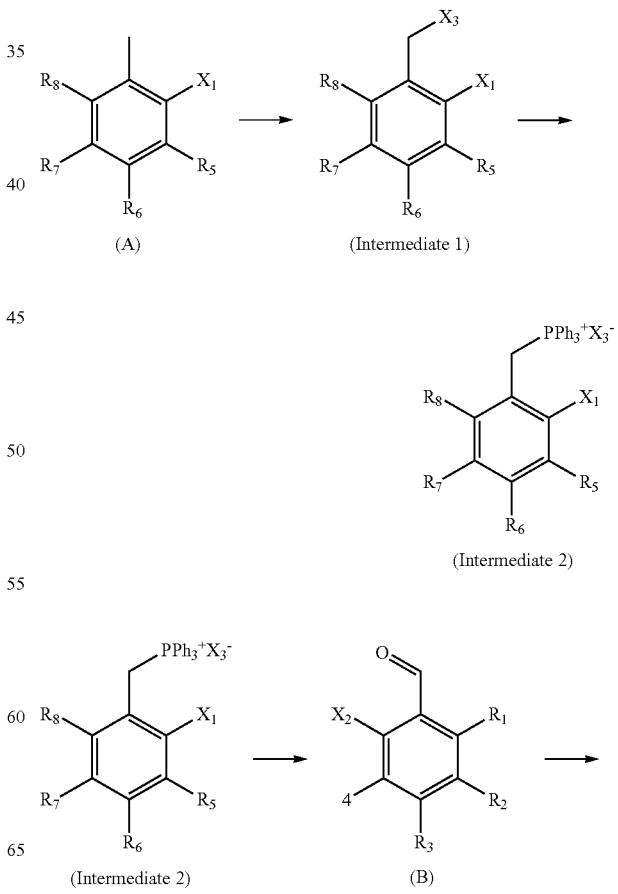

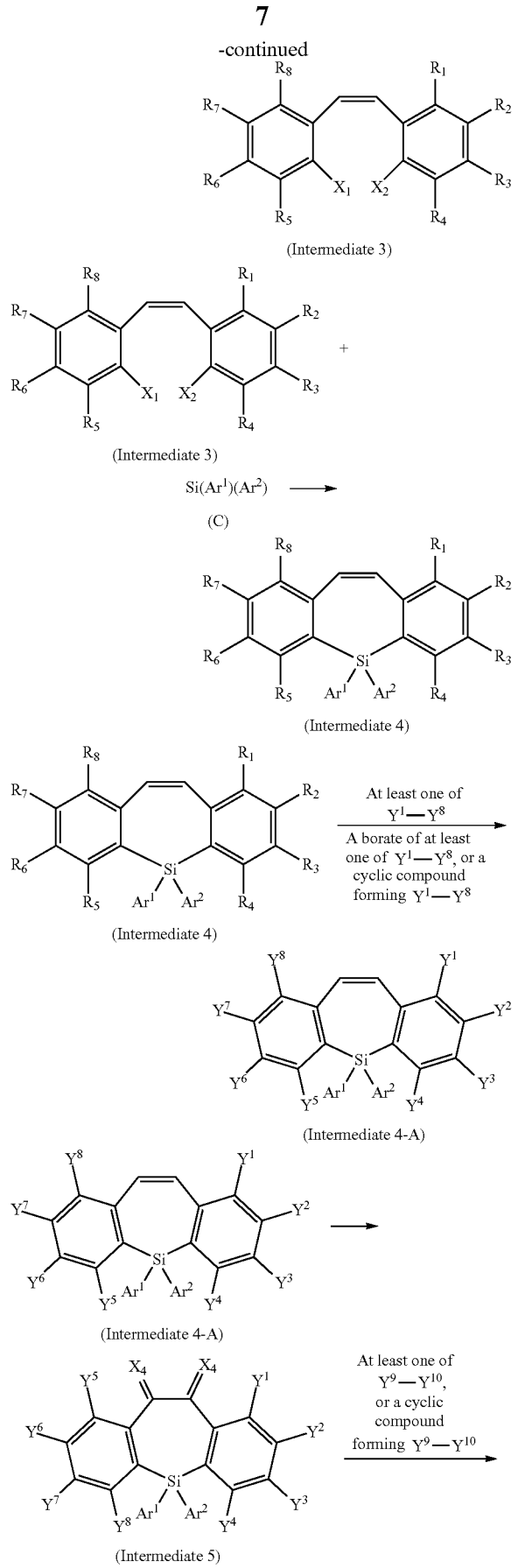

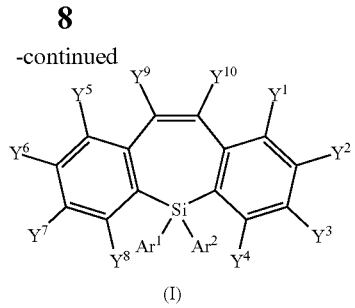

Thirdly, the invention is directed to application of the dibenzoheterocyclic compound as an organic electroluminescent material.

Fourthly, the invention is directed to application of the dibenzoheterocyclic compound in a blue light-emitting device.

Fifthly, the invention is directed to an organic light emitting diode, and at least one functional layer of the organic light emitting diode contains the dibenzoheterocyclic compound.

Preferably, in the organic light emitting diode, the functional layer is a light-emitting layer.

Preferably, in the organic light emitting diode, a light-emitting layer material includes a host material and a guest light-emitting material, and the guest light-emitting material is the dibenzoheterocyclic compound.

Preferably, in the organic light emitting diode, a light-emitting layer material includes a host material and a guest light-emitting dye, and the host material is the dibenzoheterocyclic compound.

Sixthly, the invention is directed to a display unit, including the organic light emitting diode. Unless otherwise stated, terms in the claims and the specification of the invention have the following meanings:

The alkyl group means fully saturated linear or branched hydrocarbyl group. For example, the alkyl group includes, but not limited to, methyl group, ethyl group, n-propyl group, isopropyl group, n-butyl group, sec-butyl group, isobutyl group, tert-butyl group, n-pentyl group, isopentyl group, neo-pentyl group, n-hexyl group, 3-methylhexyl group, 2,2-dimethylpentyl group, 2,3-dimethylpentyl group, n-heptyl group, n-octyl group, n-nonyl group, n-decyl group, and the like. The alkenyl group means linear or branched hydrocarbyl group containing at least one olefinic bond. For example, the alkenyl group includes, but not limited to, vinyl group, allyl group, and the like. The alkynyl group means linear or branched hydrocarbyl group containing at least one acetylenic bond, such as ethynyl group and propinyl group.

The alkoxy group means a group generated after linking the alkyl group with an oxygen atom. For example, the alkoxy group includes, but not limited to, methoxyl group (—OCH$_3$), ethoxyl group (—OCH$_2$CH$_3$), and the like. The alkenyloxy group means a group generated after linking the alkenyl group with an oxygen atom. For example, the alkenyloxy group includes, but not limited to, ethyleneoxy group (—OCH=CH$_2$), propenyloxy group (—OCH$_2$CHCH$_2$), and the like. The alkynyloxy group means a group generated after linking the alkynyl group with an oxygen atom. For example, the alkynyloxy group includes, but not limited to, ethynyloxy group (—OC—CH), propynyloxy group (—OCH$_2$C—CH), and the like. The aryloxy group means a group generated after linking the aryl group with an oxygen atom. For example, the aryloxy group includes, but not limited to

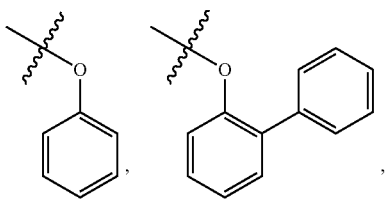 [SMILES: *Oc1ccccc1 ; *Oc1ccccc1-c1ccccc1]
and the like.

The alkylthio group means a group generated after linking the alkyl group with a sulfur atom. For example, the alkylthio group includes, but not limited to, methylthio group (—SCH$_3$), ethylthio group (—SCH$_2$CH$_3$), and the like. The alkenylthio group means a group generated after linking the alkenyl group with a sulfur atom. For example, the alkenylthio group includes, but not limited to, vinylthio group (—SCH═CH$_2$), propenylthio group (—SCH$_2$CHCH$_2$), and the like. The alkynylthio group means a group generated after linking the alkynyl group with a sulfur atom. For example, the alkynylthio group includes, but not limited to, ethynylthio group (—SC≡CH), propynylthio group (—SCH$_2$C≡CH), and the like.

The alkylamino group means a group generated after linking the alkyl group with the amino group (—NH$_2$). For example, the alkylamino group includes, but not limited to, methylamino group (—NHCH$_3$), ethylamino group (—NHCH$_2$CH$_3$), and the like. The alkenylamino group means a group generated after linking the alkenyl group with the amino group. For example, the alkenylamino group includes, but not limited to, vinylamino group (—NHCH═CH$_2$), propenylamino group (—NHCH$_2$CHCH$_2$), and the like. The alkynylamino group means a group generated after linking the alkynyl group with the amino group. For example, the alkynylamino group includes, but not limited to, ethynylamino group (—NHC═CH), propynylamino group (—NHCH$_2$C≡CH), and the like. The aromatic amino group means a group generated after linking the aryl group with the amino group (—NH$_2$). For example, the aromatic amino group includes, but not limited to, aniline, diphenylamine, and the like.

The technical scheme of the invention has the following advantages:

1. The dibenzoheterocyclic compound provided by the invention has the structure shown in the formula (I). The compound takes a dibenzo-seven-membered heterocyclic ring as a mother nucleus structure, and a diphenyl ethylene structure lowers the LUMO energy level of the dibenzoheterocyclic compound. When the dibenzoheterocyclic compound is used as a light-emitting material, the LUMO energy level of material molecules of the light-emitting layer is further matched with an adjacent electron transport layer so as to be favorable for injecting electrons into the light-emitting layer, thereby balancing the ratio of electrons to holes, increasing the combination probability of carriers, and improving the light-emitting efficiency of the device. The dibenzoheterocyclic compound has good hole transport performance, thereby being favorable for injection and transport of holes, further balancing injection and transport of carriers, avoiding combination of holes and electrons in regions close to electrodes, and further avoiding annihilation of excitons. The dibenzoheterocyclic compound having the structure shown in the formula (I) has the HOMO energy level matched with the hole transport layer, thereby lowering the potential barrier needing to be overcome by injecting holes and electrons to the light-emitting layer, and further lowering the working voltage of the device.

The Ar$^1$ and Ar$^2$ groups in the dibenzoheterocyclic compound contain aromatic rings and/or heteroaromatic rings, so that the HOMO energy level of the dibenzoheterocyclic compound is lowered, the band gap (E$_g$) between the HOMO energy level and the LUMO energy level is widened, and the dibenzoheterocyclic compound can emit light in a deep blue light region. Meanwhile, because of the wide band gap, the dibenzoheterocyclic compound is suitable for being used as a host material of the light-emitting layer, thereby ensuring efficient energy transfer from the host material to a guest material, avoiding energy return, and improving the light-emitting efficiency of the organic light emitting diode. Groups with good electron transport performance and/or hole transport property are suitable for being introduced into the Ar$^1$ and Ar$^2$ groups, thereby being favorable for transporting electrons and holes to the light-emitting layer, and lowering the driving voltage of the device.

On the other hand, the dibenzoheterocyclic compound shows a "butterfly configuration" in spatial structure, and the spatial configuration of the dibenzoheterocyclic compound ensures that molecular stacking of the material molecules can be avoided, thereby avoiding energy transfer caused by molecular stacking, avoiding generation of high energy excitons, and effectively reducing annihilation due to the existence of high energy excitons. The dibenzoheterocyclic compound can obtain stabler excitons after combination of electrons and holes, thereby being favorable for reducing efficiency roll-off of the device due to annihilation of excitons.

The dibenzoheterocyclic compound has excellent film formation performance, and a uniform amorphous film without pinholes can be formed. The dibenzoheterocyclic compound has high thermal decomposition temperature (T$_d$) and higher thermal stability, thereby being capable of avoiding thermal decomposition of the material during film formation or application, avoiding function missing of the material layer, and improving the light-emitting efficiency and light-emitting performance of the device. Ar$^1$ and Ar$^2$ contain groups of aromatic rings and/or heteroaromatic rings, thereby enhancing the rigid structure of the dibenzoheterocyclic compound, further improving the thermal stability of the material molecules, and enabling the device to maintain good working performance for a long time.

2. According to the dibenzoheterocyclic compound provided by the invention, by selecting substituent groups of Y$^1$-Y$^8$, electron withdrawing groups (pyridine, pyrimidine, triazine, pyrazine, oxadiazole, thiadiazole, quinazoline, imidazole, quinoxaline, quinoline, and the like), or electron donating groups (diphenylamine, triphenylamine, fluorene, and the like) can be further introduced into the dibenzoheterocyclic compound, and the HOMO energy level and the LUMO energy level of the material molecules are further matched with the hole transport layer and the electron transport layer at two sides, thereby being favorable for further improving injection and transport of electrons and holes and increasing the combination probability of electrons and holes. On the other hand, the HOMO energy level is distributed in the electron donating groups, the LOMO energy level is distributed in the electron withdrawing groups, the HOMO and LOMO energy levels are relatively separated in the dibenzoheterocyclic compound, a small singlet-tripletenergy level difference (ΔE$_{ST}$) can be obtained, triplet excitons (T$_1$) are converted to singlet excitons (S$_1$) through reverse intersystem crossing (RISC), and theoretically 100% internal quantum efficiency is achieved by singlet exciton luminescence. By adjusting the substituent groups, the dibenzoheterocyclic compound with thermal activation-delayed fluorescence performance can be obtained, and deep blue light with high light-emitting efficiency and light-emitting stability can be emitted.

3. The preparation method of the dibenzoheterocyclic compound provided by the invention has the advantages that the starting material is easy to obtain, the reaction conditions are mild, and the operation steps are simple. The preparation method which is simple and easy to realize is provided for large-scale production of the dibenzoheterocyclic compound.

4. At least one functional layer of the organic light emitting diode provided by the invention contains the dibenzoheterocyclic compound, where the functional layer is a light-emitting layer.

When the dibenzoheterocyclic compound is used as the guest light-emitting material of the light-emitting layer, because the band gap between the HOMO energy level and the LUMO energy level of the dibenzoheterocyclic compound is wide, deep blue light can be emitted. The LUMO energy level of the dibenzoheterocyclic compound is low, so the LUMO energy level can be well matched with the energy level of the electron transport layer, thereby being favorable for injection and transport of electrons. The dibenzoheterocyclic compound has good hole transport performance and is matched with the energy level of the hole transport layer, thereby being favorable for balancing injection and transport of electrons and holes, increasing the combination probability of carriers, and obtaining an OLED which is high in light-emitting efficiency and capable of emitting deep blue light. The spatial configuration of the dibenzoheterocyclic compound ensures that the stability of excitons in the light-emitting layer is high, and the OLED generates efficiency roll-off due to annihilation of excitons. The HOMO and LUMO energy levels of the dibenzoheterocyclic compound are matched with the hole transport layer and the electron transport layer, thereby lowering the potential barrier needing to be overcome by injecting electrons and holes to the light-emitting layer, and further lowering the driving voltage of the device. Meanwhile, the dibenzoheterocyclic compound has high thermal stability and stable film formation performance, and an OLED which is high in light-emitting efficiency, long in service life, high in color stability and capable of emitting deep blue light can be obtained. Further, by adjusting the substituent groups, the dibenzoheterocyclic compound with thermal activation-delayed fluorescence performance can be obtained, triplet excitons are up-converted to singlet excitons, and the OLED can efficiently emit light in a deep blue light-emitting region by singlet exciton luminescence.

When the dibenzoheterocyclic compound is used as the host material of the light-emitting layer, the band gap between the LUMOenergy level and the HOMO energy level of the dibenzoheterocyclic compound is wide, thereby ensuring efficient energy transfer from the host material to the guest material, inhibiting energy return from the guest material to the host material, and increasing the light-emitting efficiency of the OLED. Further, by adjusting the substituent groups, the dibenzoheterocyclic compound has a smallerenergy level difference ($\Delta E_{ST}$) between a singlet state $S_1$ and a triplet state $T_1$ so as to promote up-conversion of triplet excitons of the host material to singlet excitons through RISC, thereby promoting FÖrster energy transfer from the host material to the guest material, inhibiting Dexter energy transfer, reducing energy loss during Dexter energy transfer, effectively reducing the efficiency roll-off of the OLED, and increasing the external quantum efficiency of the device.

BRIEF DESCRIPTION OF THE DRAWINGS

In order to more clearly illustrate the technical schemes in the detailed description of the invention or the prior art, the drawings required in the detailed description of the specific embodiments or the description of the prior art are simply described below. Obviously, the drawings in the following description are some embodiments of the invention, and a person of ordinary skill in the art can also obtain other drawings according to these drawings without any creative work.

REFERENCE NUMERALS IN THE DRAWINGS

Figure 1:
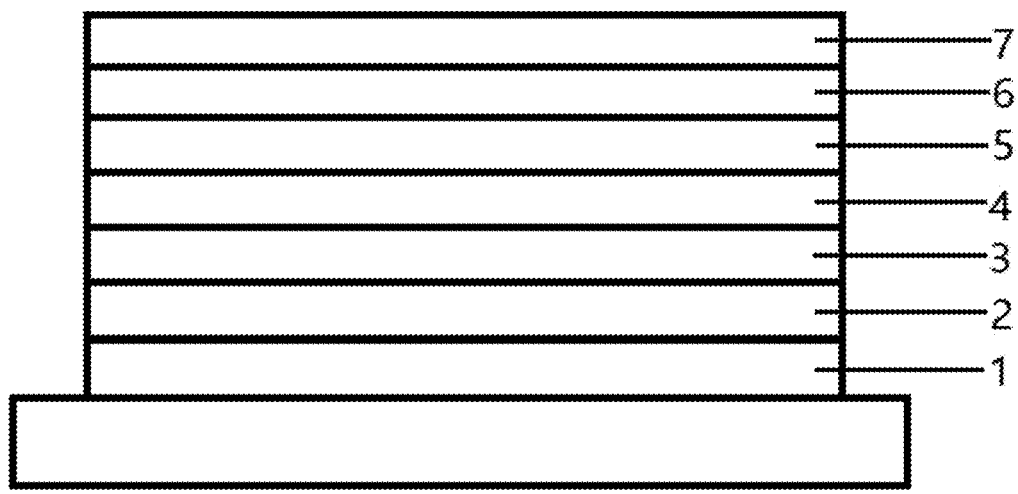
FIG. 1 is a structural schematic diagram of an organic light emitting diode according to embodiments 13-17 and a contrast 1 of the invention.
Figure 2:
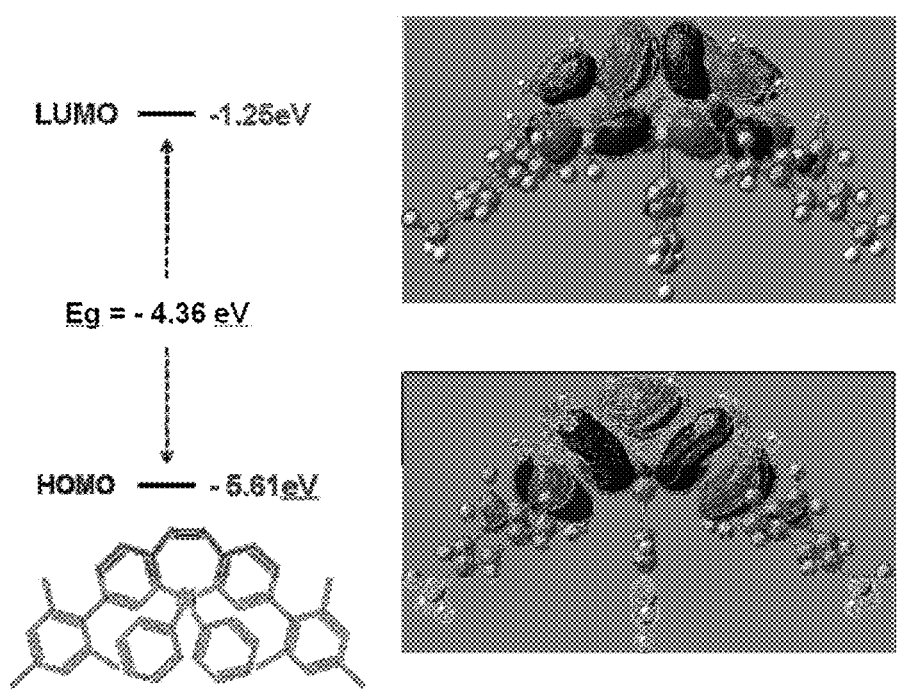
FIG. 2 is a diagram showing theoretical calculation results of the HOMO energy level, the LUMO energy level and $E_g$ of a compound shown in the formula SA-08 provided by an embodiment 6 in the present application.
Figure 3:
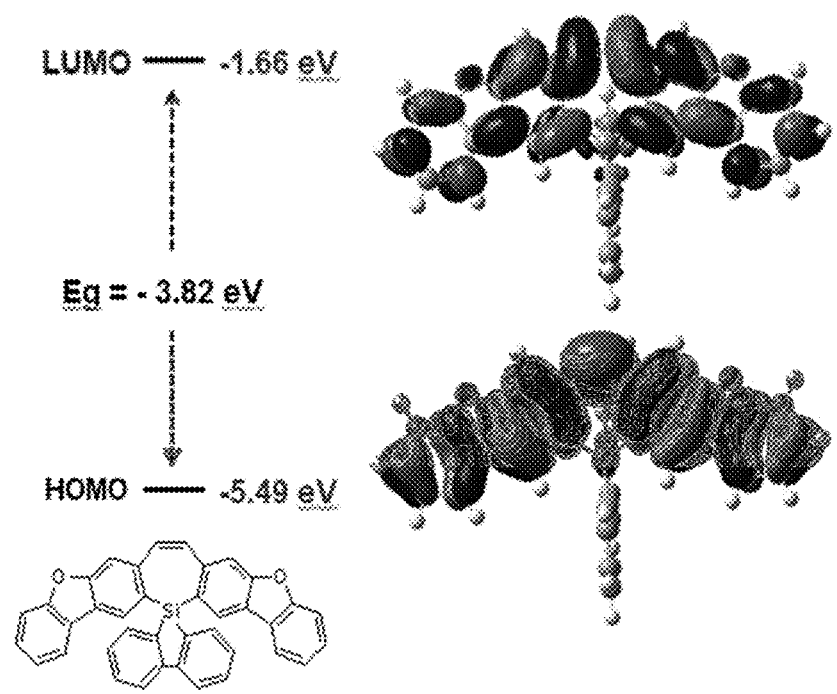
FIG. 3 is a diagram showing theoretical calculation results of the HOMO level, LUMO level and $E_g$ of the compound shown in the formula SA-34 provided by an embodiment 11 in the present application.

1—anode, 2—hole injection layer, 3—hole transport layer, 4—light-emitting layer, 5—electron transport layer, 6—electron injection layer, and 7—cathode.

DETAILED DESCRIPTION

The technical schemes of the invention will be clearly and completely described below. Obviously, the described embodiments are only a part of the embodiments of the invention but not all of the embodiments. Based on the embodiments in the invention, all other embodiments obtained by a person of ordinary skill in the art without creative work belong to the scope of protection of the invention. In addition, the technical features involved in different embodiments of the invention described below can be combined with one other as long as the technical features do not conflict with one other.

In the description of the invention, it should be noted that the terms "first", "second" and "third" are used for description only and are not intended to indicate or imply relative importance.

The invention can be implemented in many different forms and should not be construed as being limited to the embodiments stated herein. Instead, by providing these embodiments, the present disclosure is thorough and complete, the concept of the invention is fully delivered to those skilled in the art, and the invention is limited only by the claims. In the drawings, for clarity, the dimensions and relative dimensions of layers and regions are exaggerated. It should be understood that, when a component, such as a layer, is known as "formed on" or "arranged on" another component, this component can be directly arranged on the another component, or an intermediate component can be arranged. On the contrary, when the component is known as "directly formed on" or "directly arranged on" another component, the intermediate component is not arranged.

Embodiment 1

This embodiment provides a synthesis method of an intermediate 4-1, and a synthesis route of the intermediate 4-1 is as shown below:

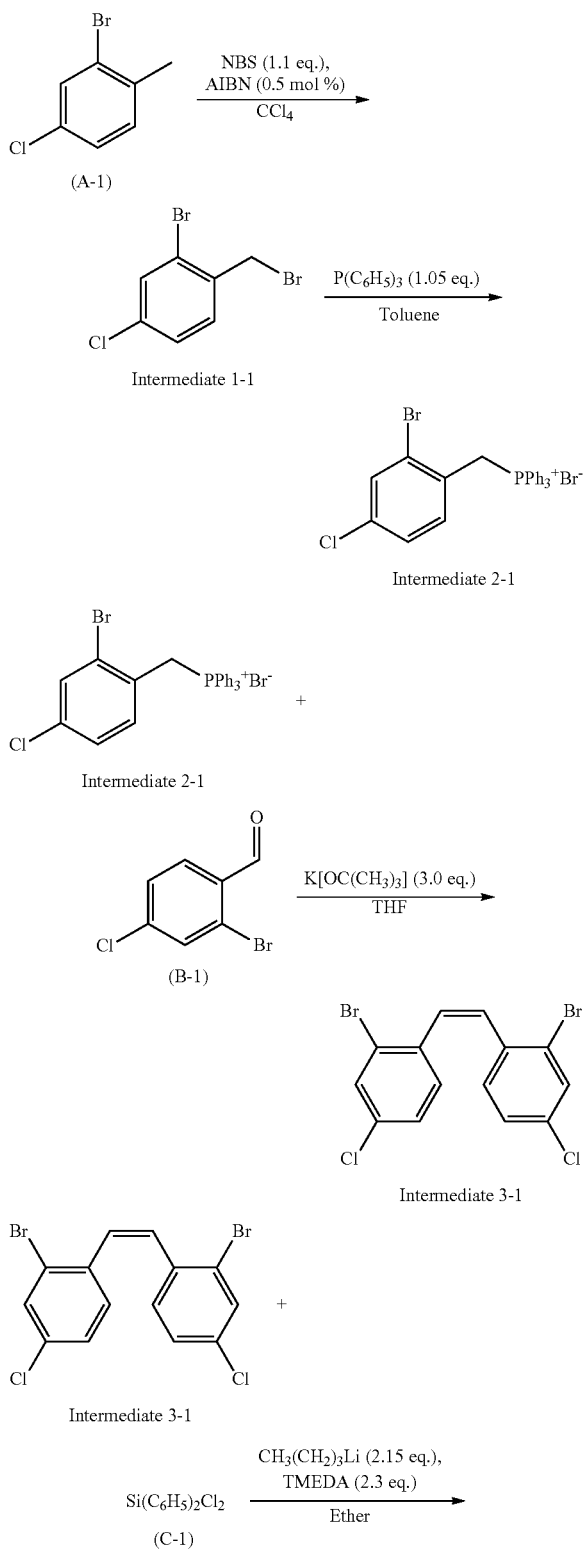

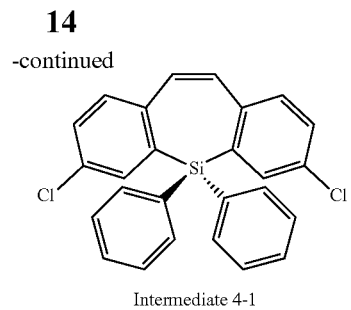

Intermediate 4-1

The synthesis method of the intermediate 4-1 includes the following steps:

1. Preparation of Intermediate 1-1

In a dry, nitrogen-flushed 2-1 double-neck round-bottom flask, equipped with a magnetic stirring bar and a reflux tube, a compound (205.484 g, 1.0 equivalent) shown in the formula A-1, NBS (195.783 g, 1.1 equivalent), AIBN (8.211 g, 0.5 mol percent), and carbon tetrachloride (1 L) were respectively added firstly, the mixture was stirred for 10 minutes, and finally, the mixture was heated refluxly for 24 hours. After reaction, water (200 ml) was added to quench the reaction, the reaction solution was extracted, and the combined extraction liquids were dried over magnesium sulfate, filtered, and concentrated under vacuum. The crude product was purified by means of column chromatographic (ethyl acetate/hexane, 1/10) to obtain the intermediate 1-1 (250.260 g, yield: 88%).

2. Preparation of Intermediate 2-1

In a dry, nitrogen-flushed 2 L double-neck round-bottom flask, equipped with a magnetic stirring bar and a reflux tube, the intermediate 1-1 (200.000 g, 1.0 equivalent), triphenylphosphine (193.692 g, 1.05 equivalent), and toluene (1 L) were respectively added firstly, the mixture was stirred for 10 minutes, and finally, the mixture was heated refluxly for 18 hours; and after reaction, the mixture was filtered, and then, the obtained solid was cleaned with hexane (3*800 ml) to obtain a crude product (397.086 g) of the intermediate 2-1.

3. Preparation of Intermediate 3-1

In a dry, nitrogen-flushed 2-liter double-neck round-bottom flask, equipped with a magnetic stirring bar, the intermediate 2-1 (350.000 g, 1.0 equivalent), potassium tert-butoxide (215.534 g, 3.0 equivalent), and tetrahydrofuran (500 ml) were respectively added firstly, the mixture was stirred for 10 minutes at 0° C., subsequently, 2-bromo-4-chlorobenzaldehyde (a compound shown in the formula B-1) (140.512 g, 1.0 equivalent) dissolved in tetrahydrofuran (300 ml) was added dropwise, and finally, the reaction was stirred for 24 hours at room temperature; after reaction, water (400 ml) was added to quench the reaction. After extraction with ethyl ether (3*1000 ml), the combined extraction liquids were dried over magnesium sulfate, filtered, and concentrated under vacuum. The crude product was purified by means of column chromatography (ethyl acetate/hexane, 1/80) to obtain the intermediate 3-1 (253.062 g, yield: 91%).

4. Preparation of Intermediate 4-1

In a dry, nitrogen-flushed 2-liter double-neck round-bottom flask, equipped with a magnetic stirring bar, the intermediate 3-1 (203.466 g, 1.0 equivalent) and anhydrous tetrahydrofuran (500 ml) were added, the mixture was stirred for 10 minutes at −78° C., subsequently, 2.5 M butyl lithium dissolved in hexane (430 ml, 2.15 equivalent) was added dropwise and the reaction was stirred for 30 minutes, N,N,N',N'-tetramethyl-1,2-ethanediamine (170 ml, 2.3 equivalent) was added dropwise and the reaction was stirred for 2 hours, and finally, dichlorodiphenylsilane (the compound shown in the formula C-1) (139.263 g, 1.1 equivalent) was added dropwise; after reaction, a saturated sodium bicarbonate aqueous solution (250 ml) was added to quench the reaction. After extraction with ethyl acetate (3*500 ml), the combined extraction liquids were dried over magnesium sulfate, filtered, and concentrated under vacuum. The crude product was purified by means of column chromatography (ethyl acetate/hexane, 1/35) to obtain the intermediate 4-1 (103.556 g, yield: 84%).

Embodiment 2

This embodiment provides a synthesis method of an intermediate 4-2, and a synthesis route of the intermediate 4-2 is as shown below:

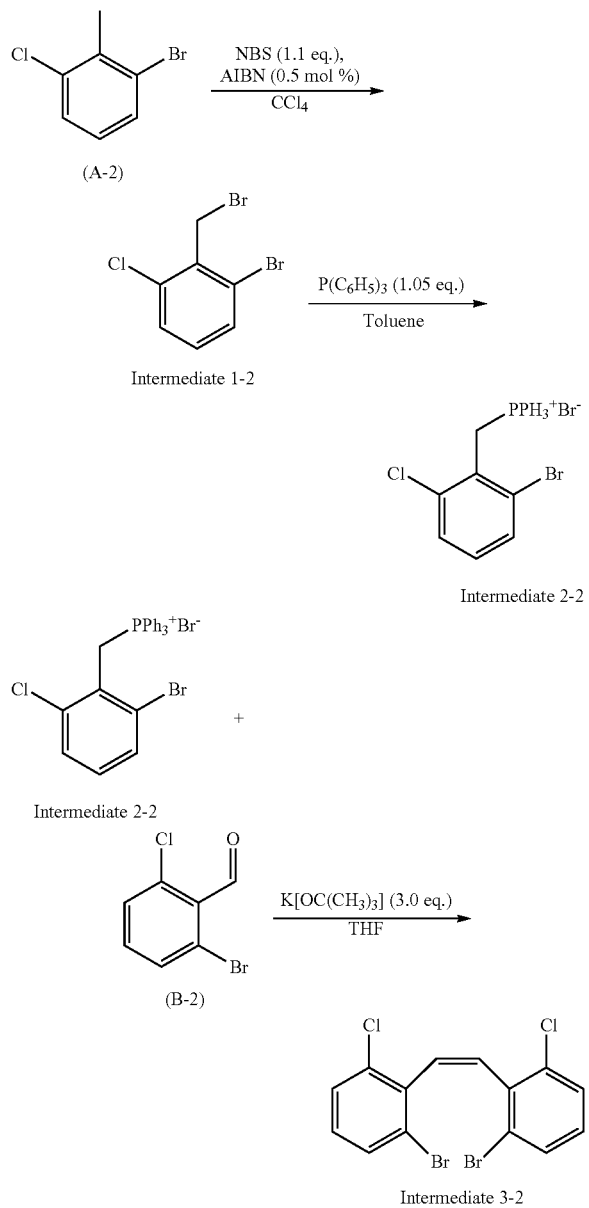

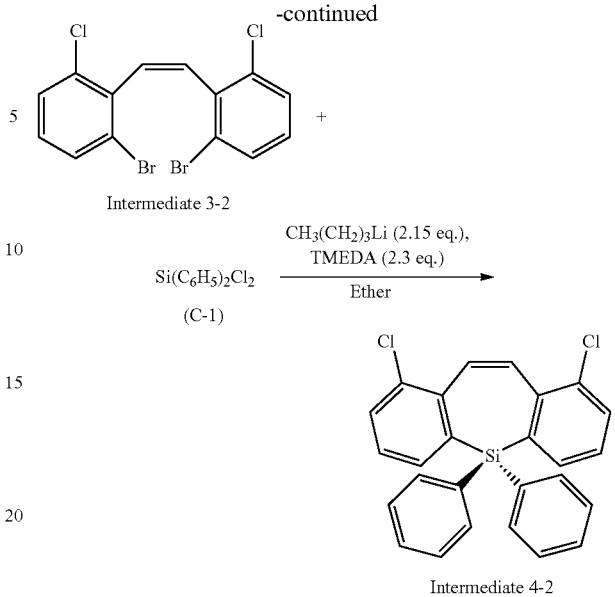

The synthesis method of the intermediate 4-2 includes the following steps:

1. Preparation of Intermediate 1-2

In a dry, nitrogen-flushed 500-ml double-neck round-bottom flask, equipped with a magnetic stirring bar and a reflux tube, a compound (20.548 g, 1.0 equivalent) shown in the formula A-2, NBS (19.578 g, 1.1 equivalent), AIBN (0.821 g, 0.5 mol percent), and carbon tetrachloride (250 ml) were respectively added firstly, the mixture was stirred for 10 minutes, and finally, the mixture was heated refluxly for 24 hours; after reaction, water (200 ml) was added to quench the reaction. After extraction with ethyl acetate (3*200 ml), the combined extraction liquids were dried over magnesium sulfate, filtered, and concentrated under vacuum. The crude product was purified by means of column chromatography (ethyl acetate/hexane, 1/10) to obtain the intermediate 1-2 (16.747 g, yield: 78%).

2. Preparation of Intermediate 2-2

In a dry, nitrogen-flushed 500-ml double-neck round-bottom flask, equipped with a magnetic stirring bar and a reflux tube, the intermediate 1-2 (20.000 g, 1.0 equivalent), triphenylphosphine (19.369 g, 1.05 equivalent), and toluene (250 ml) were respectively added firstly, the mixture was stirred for 10 minutes, and finally, the mixture was heated refluxly for 18 hours; and after reaction, the mixture was filtered, and then, the obtained solid was cleaned with hexane (3*80 ml) to obtain a crude product (38.231 g) of the intermediate 2-2.

3. Preparation of Intermediate 3-2

In a dry, nitrogen-flushed 500-ml double-neck round-bottom flask, equipped with a magnetic stirring bar, the intermediate 2-2 (35.000 g, 1.0 equivalent), potassium tert-butoxide (21.553 g, 3.0 equivalent), and tetrahydrofuran (150 ml) were respectively added the mixture was stirred for 10 minutes at 0° C., subsequently, 2-bromo-6-chlorobenzaldehyde (a compound shown in the formula B-2) (14.051 g, 1.0 equivalent) dissolved in tetrahydrofuran (100 ml) was added dropwise, and finally, the reaction was stirred for 24 hours at room temperature; after reaction, water (50 ml) was added to quench the reaction. After extraction with ethyl ether (3*300 ml), the combined extraction liquids were dried over magnesium sulfate, filtered, and concentrated under vacuum. The crude product was purified by means of column chromatography (ethyl acetate/hexane, 1/75) to obtain the intermediate 3-2 (23.969 g, yield: 92%).

4. Preparation of Intermediate 4-2

In a dry, nitrogen-flushed 500-ml double-neck round-bottom flask, equipped with a magnetic stirring bar, firstly the intermediate 3-2 (20.346 g, 1.0 equivalent) and anhydrous tetrahydrofuran (180 ml) were added, the mixture was stirred for 10 minutes at −78° C., subsequently, 2.5 M butyl lithium dissolved in hexane (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, dichlorodiphenylsilane (the compound shown in the formula C-1) (13.926 g, 1.1 equivalent) was added dropwise; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/30) to obtain the intermediate 4-2 (9.616 g, yield: 78%).

Embodiment 3

This embodiment provides a synthesis method of an intermediate 4-3, and a synthesis route of the intermediate 4-3 is as shown below:

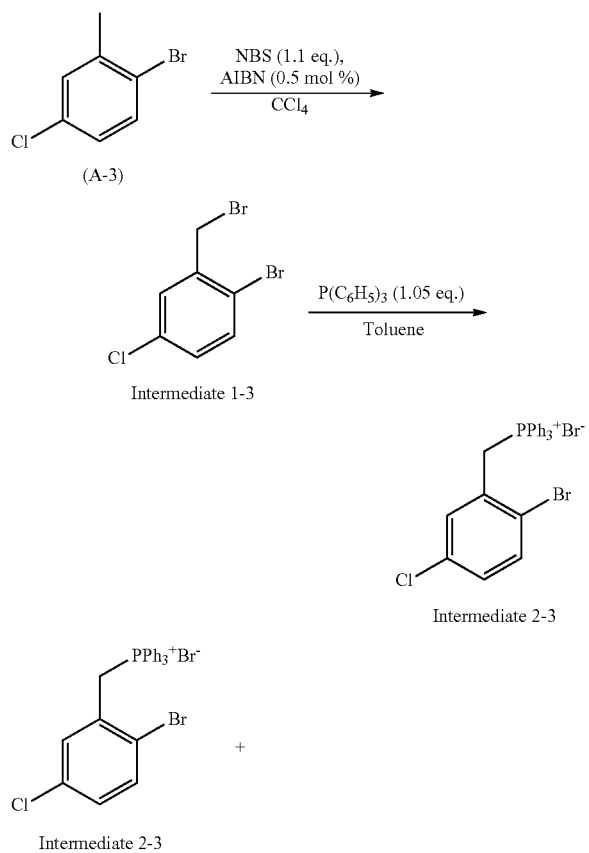

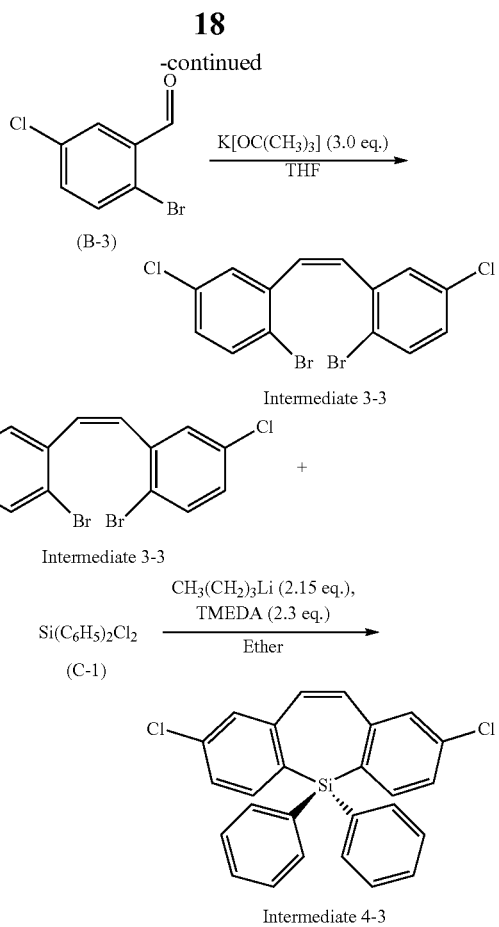

The synthesis method of the intermediate 4-3 includes the following steps:

1. Preparation of Intermediate 1-3

In a dry, nitrogen-flushed 500-ml double-neck round-bottom flask, equipped with a magnetic stirring bar and a reflux tube, a compound (20.548 g, 1.0 equivalent) shown in the formula A-3, NBS (19.578 g, 1.1 equivalent), AIBN (0.821 g, 0.5 mol percent), and carbon tetrachloride (250 ml) were respectively added firstly, the mixture was stirred for 10 minutes, and finally, the mixture was heated refluxly for 24 hours; after reaction, water (200 ml) was added to quench the reaction. After extraction with ethyl acetate (3*200 ml), the combined extraction liquids were dried over magnesium sulfate, filtered, and concentrated under vacuum. The crude product was purified by means of column chromatography (ethyl acetate/hexane, 1/10) to obtain the intermediate 1-3 (20.191 g, yield: 71%).

2. Preparation of Intermediate 2-3

In a dry, nitrogen-flushed 500-ml double-neck round-bottom flask, equipped with a magnetic stirring bar and a reflux tube, the intermediate 1-3 (20.000 g, 1.0 equivalent), triphenylphosphine (19.369 g, 1.05 equivalent), and toluene (250 ml) were respectively added firstly, the mixture was stirred for 10 minutes, and finally, the mixture was heated refluxly for 18 hours; and after reaction, the mixture was filtered, and then, the obtained solid was cleaned with hexane (3*80 ml) to obtain a crude product (38.466 g) of the intermediate 2-3.

3. Preparation of Intermediate 3-3

In a dry, nitrogen-flushed 500-ml double-neck round-bottom flask, equipped with a magnetic stirring bar, the intermediate 2-3 (35.000 g, 1.0 equivalent), potassium tert-butoxide (21.553 g, 3.0 equivalent), and tetrahydrofuran (150 ml) were respectively added firstly, the mixture was stirred for 10 minutes at 0° C., subsequently, 2-bromo-5-chlorobenzaldehyde (a compound shown in the formula B-3) (14.051 g, 1.0 equivalent) dissolved in tetrahydrofuran (100 ml) was added dropwise, and finally, the reaction was stirred for 24 hours at room temperature; after reaction, water (50 ml) was added to quench the reaction. After extraction with ethyl ether (3*300 ml), the combined extraction liquids were dried over magnesium sulfate, filtered, and concentrated under vacuum. The crude product was purified by means of column chromatography (ethyl acetate/hexane, 1/70) to obtain the intermediate 3-3 (23.187 g, yield: 89%).

4. Preparation of Intermediate 4-3

In a dry, nitrogen-flushed 500-ml double-neck round-bottom flask, equipped with a magnetic stirring bar, the intermediate 3-3 (20.346 g, 1.0 equivalent), and anhydrous tetrahydrofuran (180 ml) were added, the mixture was stirred for 10 minutes at −78° C., subsequently, 2.5 M butyl lithium dissolved in hexane (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, dichlorodiphenylsilane (the compound shown in the formula C-1) (13.926 g, 1.1 equivalent) was added dropwise; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/30) to obtain the intermediate 4-3 (8.383 g, yield: 68%).

Embodiment 4

This embodiment provides a synthesis method of an intermediate 4-4, and a synthesis route of the intermediate 4-4 is as shown below:

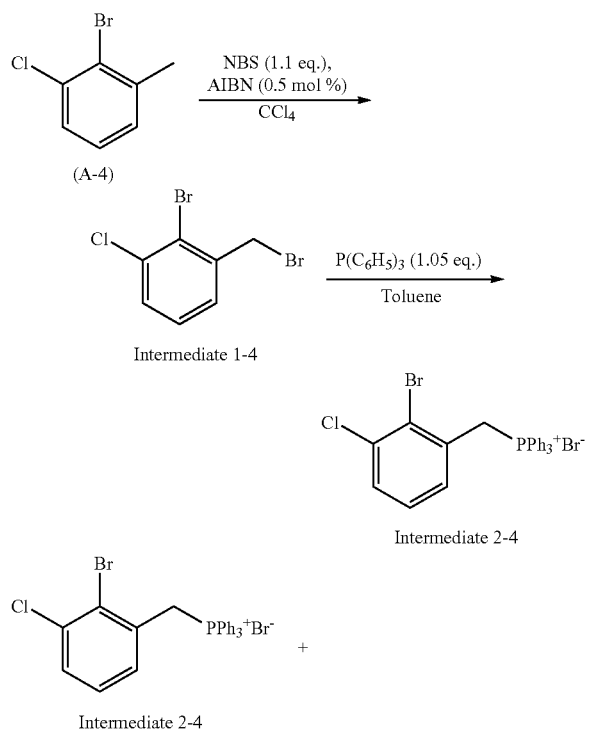

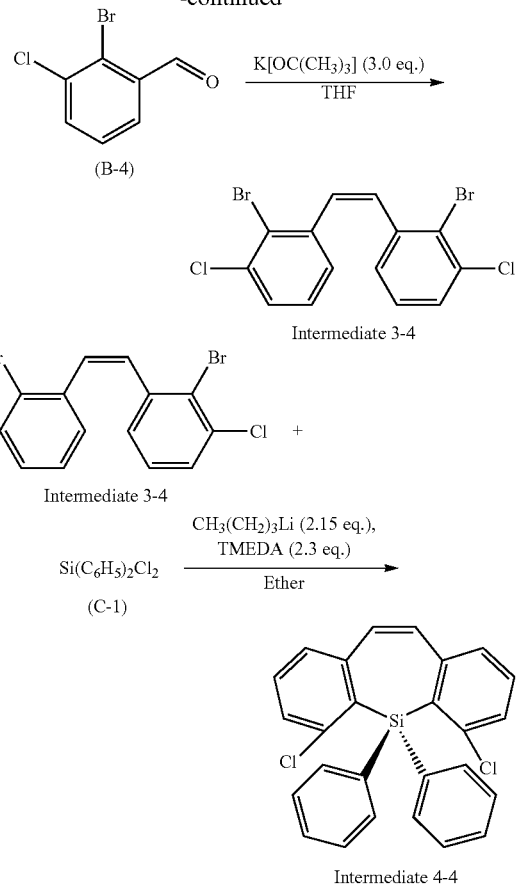

The synthesis method of the intermediate 4-4 includes the following steps:

1. Preparation of Intermediate 1-4

In a dry, nitrogen-flushed 500-ml double-neck round-bottom flask, equipped with a magnetic stirring bar and a reflux tube, firstly a compound (20.548 g, 1.0 equivalent) shown in the formula A-4, NBS (19.578 g, 1.1 equivalent) and AIBN (0.821 g, 0.5 mol percent), then, carbon tetrachloride (250 ml) were respectively added, the mixture was stirred for 10 minutes, and finally, the mixture was heated refluxly for 24 hours; after reaction, water (200 ml) was added to quench the reaction. After extraction with ethyl acetate (3*200 ml), the combined extraction liquids were dried over magnesium sulfate, filtered, and concentrated under vacuum. The crude product was purified by means of column chromatography (ethyl acetate/hexane, 1/10) to obtain the intermediate 1-4 (23.867 g, yield: 65%).

2. Preparation of Intermediate 2-4

In a dry, nitrogen-flushed 500-ml double-neck round-bottom flask, equipped with a magnetic stirring bar and a reflux tube, the intermediate 1-4 (20.000 g, 1.0 equivalent), triphenylphosphine (19.369 g, 1.05 equivalent), and toluene (250 ml) respectively the mixture was stirred for 10 minutes, and finally, the mixture was heated refluxly for 18 hours; and after reaction, and then, the obtained solid was cleaned with hexane (3*80 ml) to obtain a crude product (37.831 g) of the intermediate 2-4.

3. Preparation of Intermediate 3-4

In a dry, nitrogen-flushed 500-ml double-neck round-bottom flask, equipped with a magnetic stirring bar, the intermediate 2-4 (35.000 g, 1.0 equivalent), potassium tert-butoxide (21.553 g, 3.0 equivalent), and tetrahydrofuran (150 ml) were respectively added firstly, the mixture was stirred for 10 minutes at 0° C., subsequently, 2-bromo-3-chlorobenzaldehyde (a compound as shown in the formula B-4) (14.051 g, 1.0 equivalent) dissolved in tetrahydrofuran (100 ml) was added dropwise, and finally, the reaction was stirred for 24 hours at room temperature; after reaction, water (50 ml) was added to quench the reaction. After extraction with ethyl ether (3*300 ml), the combined extraction liquids were dried over magnesium sulfate, filtered, and concentrated under vacuum. The crude product was purified by means of column chromatography (ethyl acetate/hexane, 1/75) to obtain the intermediate 3-4 (22.525 g, yield: 81%).

4. Preparation of Intermediate 4-4

In a dry, nitrogen-flushed 500-ml double-neck round-bottom flask, equipped with a magnetic stirring bar, the intermediate 3-4 (20.346 g, 1.0 equivalent) and anhydrous tetrahydrofuran (180 ml) were added, the mixture was stirred for 10 minutes at −78° C., subsequently, 2.5 M butyl lithium dissolved in hexane (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, dichlorodiphenylsilane (the compound shown in the formula C-1) (13.926 g, 1.1 equivalent) was added dropwise; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/30) to obtain the intermediate 4-4 (6.780 g, yield: 47%).

Embodiment 5

This embodiment provides a dibenzoheterocyclic compound having a structure as shown in the formula SA-03 below:

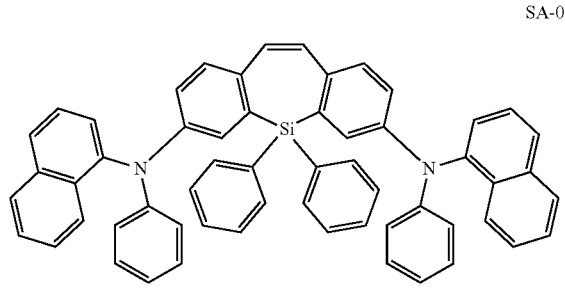

SA-03

A synthesis route of the dibenzoheterocyclic compound shown in the formula SA-03 is as shown below:

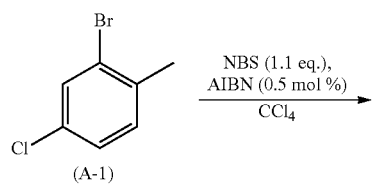

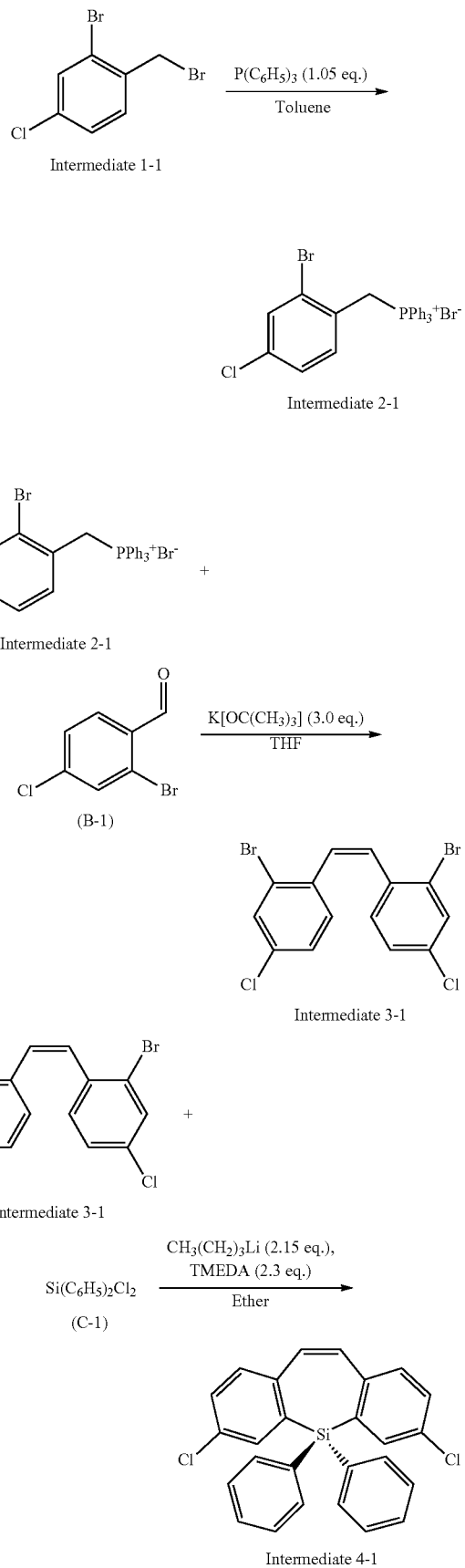

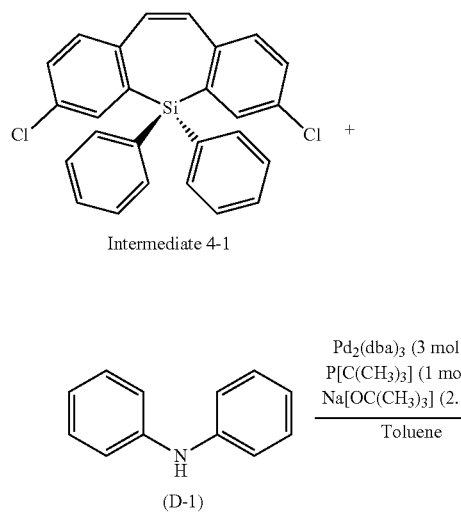

Intermediate 4-1

+

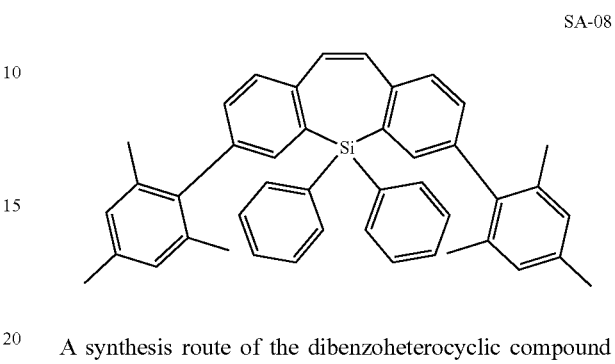

(D-1)

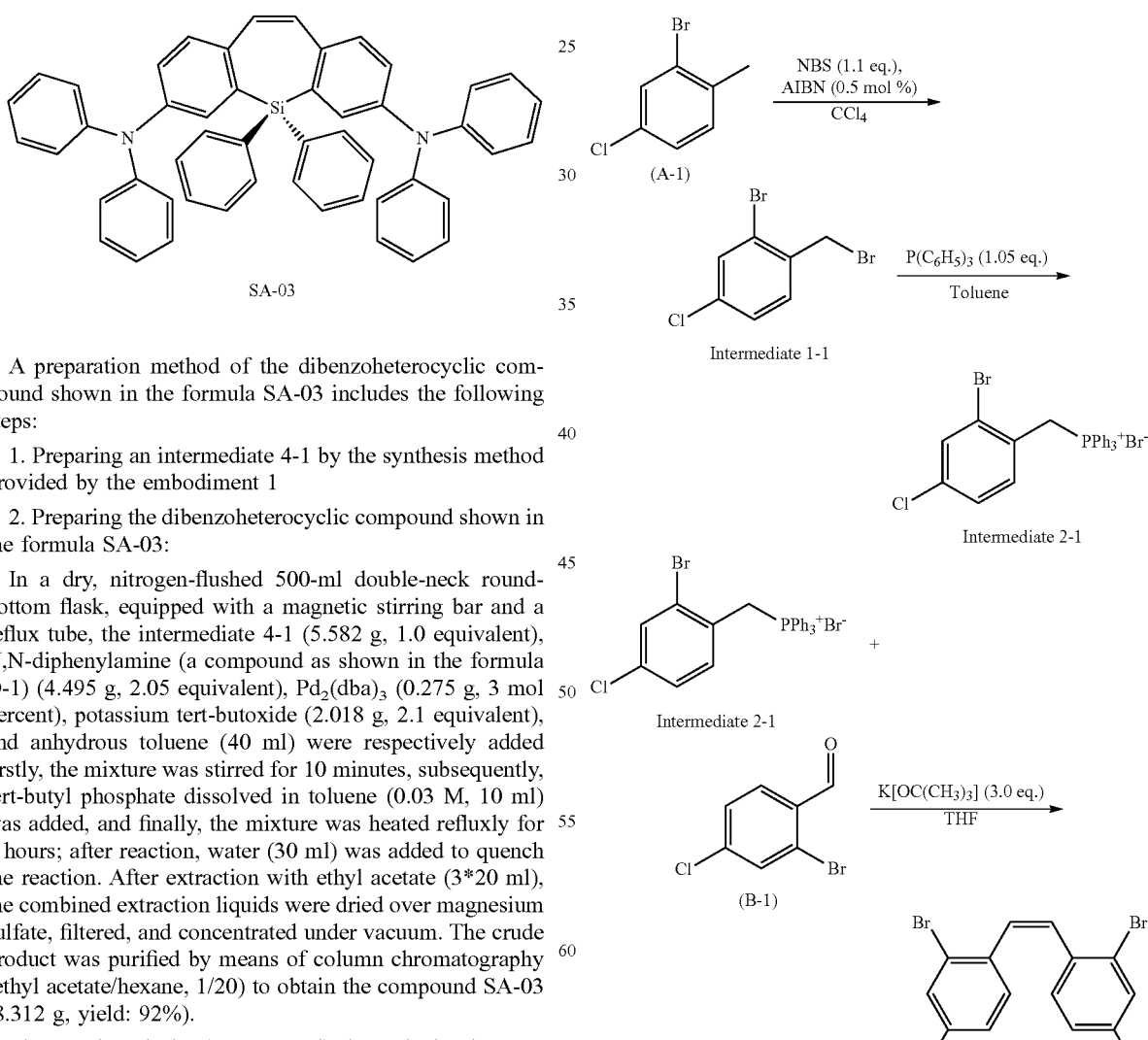

SA-03

A preparation method of the dibenzoheterocyclic compound shown in the formula SA-03 includes the following steps:

1. Preparing an intermediate 4-1 by the synthesis method provided by the embodiment 1

2. Preparing the dibenzoheterocyclic compound shown in the formula SA-03:

In a dry, nitrogen-flushed 500-ml double-neck round-bottom flask, equipped with a magnetic stirring bar and a reflux tube, the intermediate 4-1 (5.582 g, 1.0 equivalent), N,N-diphenylamine (a compound as shown in the formula D-1) (4.495 g, 2.05 equivalent), Pd$_2$(dba)$_3$ (0.275 g, 3 mol percent), potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SA-03 (8.312 g, yield: 92%).

Elemental analysis: (C$_{50}$H$_{38}$N$_2$Si) theoretical values: C, 86.42; H, 5.51; N, 4.03; measured values: C, 86.39; H, 5.52; N, 4.7; HRMS (ESI) m/z (M$^+$): theoretical value: 694.2804; measured value: 694.2795.

Embodiment 6

This embodiment provides a dibenzoheterocyclic compound having a structure as shown in the formula SA-08 below:

A synthesis route of the dibenzoheterocyclic compound shown in the formula SA-08 is as shown below:

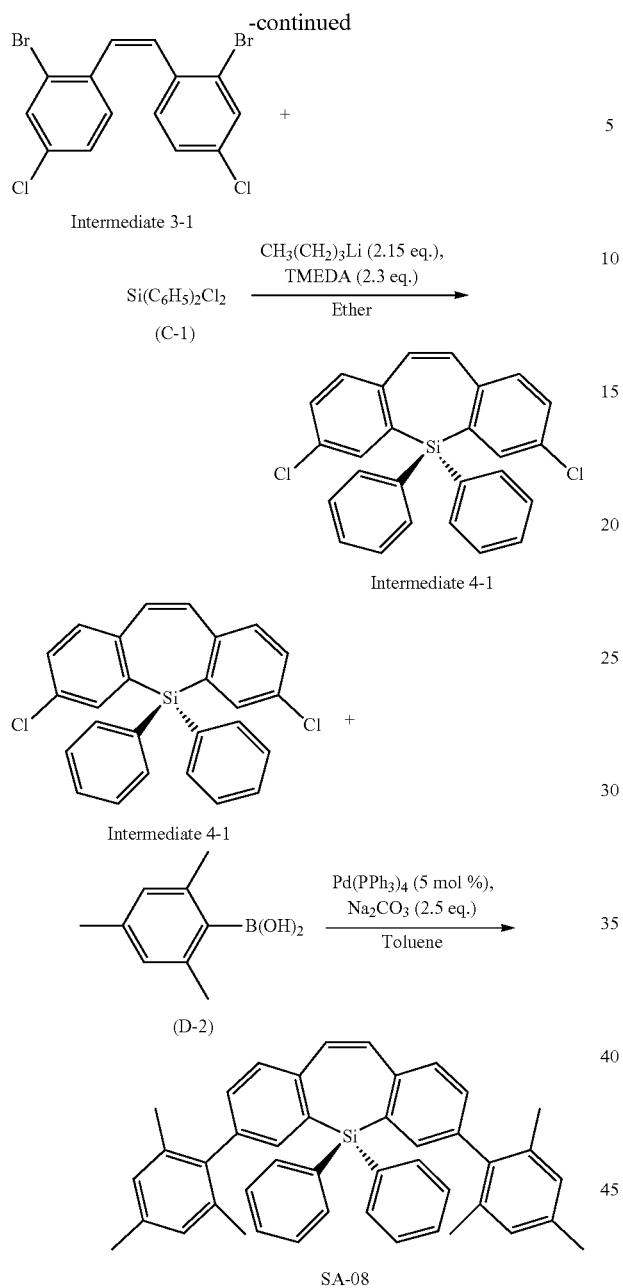

reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SA-08 (4.811 g, yield: 62%).

Elemental analysis: ($C_{44}H_{40}Si$) theoretical values: C, 88.54; H, 6.76; measured values: C, 88.50; H, 6.75; HRMS (EI) m/z ($M^+$): theoretical value: 596.2899; measured value: 596.2903.

Embodiment 7

This embodiment provides a dibenzoheterocyclic compound having a structure as shown in the formula SA-11 below:

SA-11

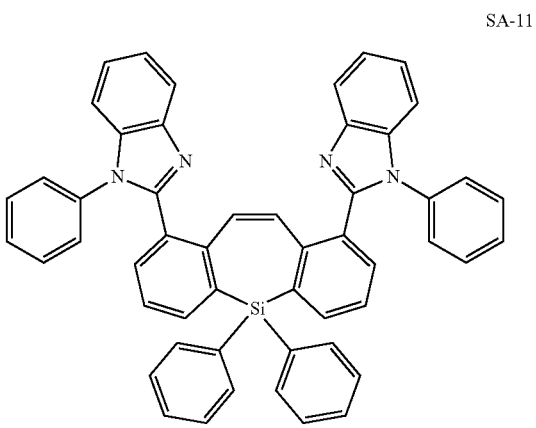 [SMILES: C1=Cc2c(-c3nc4ccccc4n3-c3ccccc3)cccc2[Si](c2ccccc2)(c2ccccc2)c2cccc(-c3nc4ccccc4n3-c3ccccc3)c21]

A synthesis route of the dibenzoheterocyclic compound shown in the formula SA-11 is as shown below:

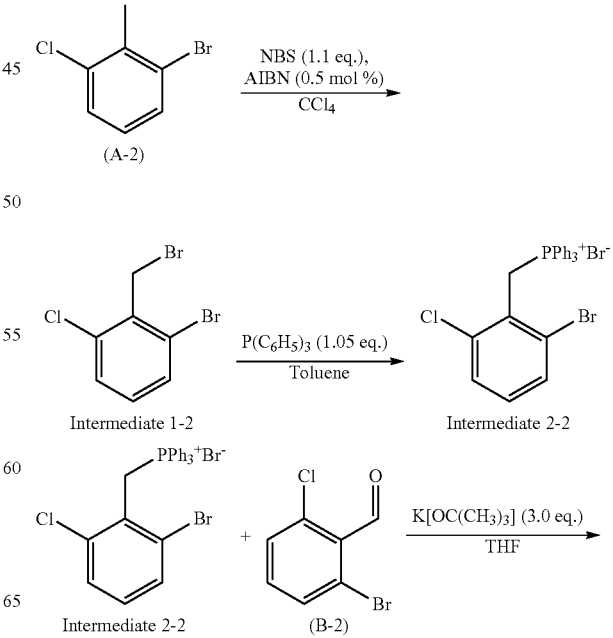

A preparation method of the dibenzoheterocyclic compound shown in the formula SA-08 includes the following steps:

1. Preparing an intermediate 4-1 by the synthesis method provided by the embodiment 1
2. Preparing the dibenzoheterocyclic compound shown in the formula SA-08:

In a dry, nitrogen-flushed 100-ml double-neck round-bottom flask, equipped with a magnetic stirring bar and a reflux tube, the intermediate 4-1 (5.582 g, 1.0 equivalent), 4-(N,N-diphenylamino)phenylboric acid (a compound as shown in the formula D-2) (4.904 g, 2.3 equivalent), Pd(PPh₃)₄ (0.578 g, 5 mol percent), sodium carbonate (2.649 g, 2.5 equivalent), toluene (40 ml) and water (4 ml) were respectively added firstly, the mixture was stirred for 10 minutes, and finally, the mixture was heated refluxly for 18 hours; after reaction, water (30 ml) was added to quench the

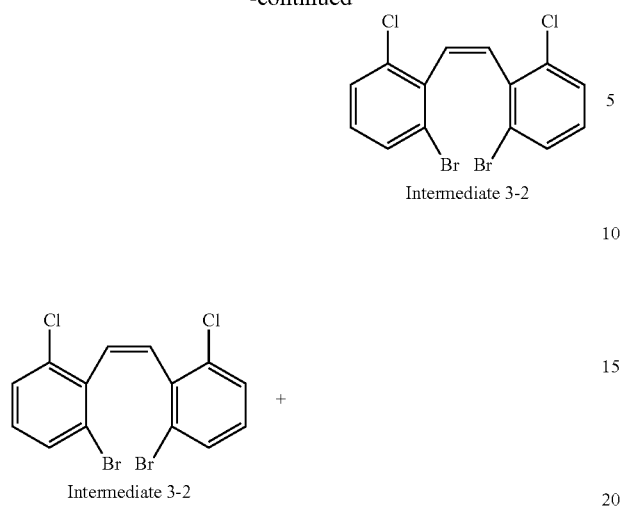

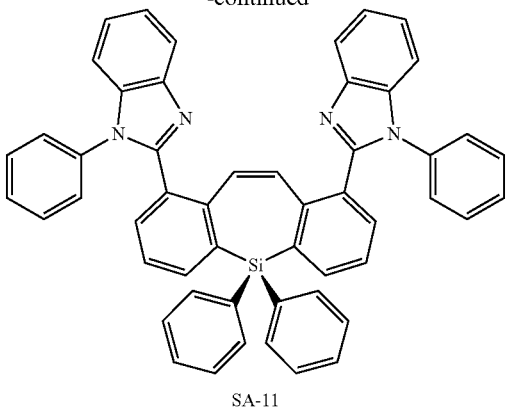

A preparation method of the dibenzoheterocyclic compound shown in the formula SA-11 includes the following steps:

1. Preparing an intermediate 4-2 by the synthesis method provided by the embodiment 2

2. Preparing the dibenzoheterocyclic compound shown in the formula SA-11:

(1) In a dry, nitrogen-flushed 500-ml double-neck round-bottom flask, equipped with a magnetic stirring bar, the intermediate 4-2 (5.582 g, 1.0 equivalent) and anhydrous tetrahydrofuran (180 ml) were added firstly, the mixture was stirred for 10 minutes at −78° C., subsequently, 2.5 M butyl lithium dissolved in hexane (13.0 ml, 2.5 equivalent) was added dropwise and the reaction was stirred for 30 minutes, and N,N-dimethyl formamide (1.0 ml, 2.5 equivalent) was added dropwise and the reaction was stirred for 2 hours; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/25) to obtain an intermediate 4-2-1 (3.899 g, yield: 72%).

(2) In a dry, nitrogen-flushed 100-ml double-neck round-bottom flask, equipped with a magnetic stirring bar and a reflux tube, the intermediate 4-2-1 (3.332 g, 1.0 equivalent), N-phenyl-o-phenylenediamine (a compound shown in the formula D-3) (3.022 g, 2.05 equivalent), and toluene (50 ml) were respectively added firstly, the mixture was stirred for 10 minutes, and finally, the mixture was heated refluxly for 36 hours; after reaction, water (30 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/15) to obtain the compound SA-11 (5.185 g, yield: 87%).

Elemental analysis: ($C_{52}H_{36}N_4Si$) theoretical values: C, 83.84; H, 4.87; N, 7.52; measured values: C, 83.81; H, 4.85; N, 7.55; HRMS (ESI) m/z (M$^+$): theoretical value: 744.2709; measured value: 744.2713.

Embodiment 8

This embodiment provides a dibenzoheterocyclic compound having a structure as shown in the formula SA-20 below:

SA-20
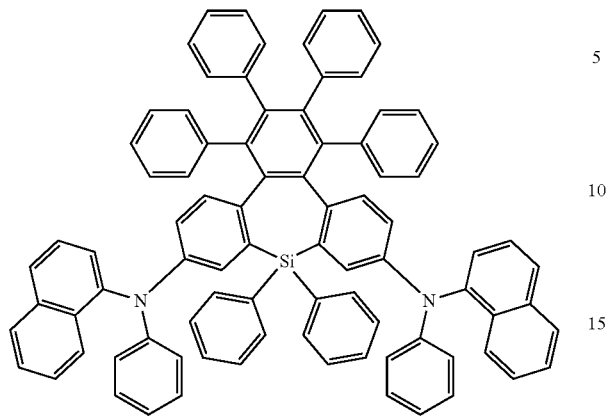
A synthesis route of the dibenzoheterocyclic compound shown in the formula SA-20 is as follows:
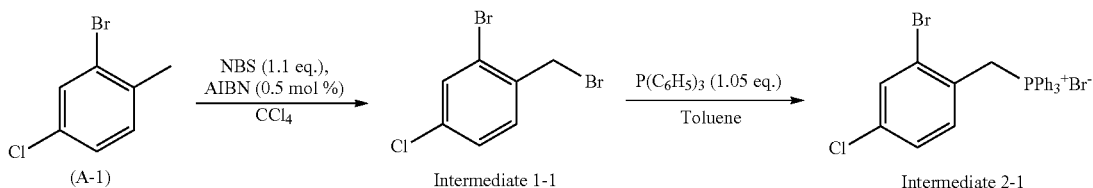
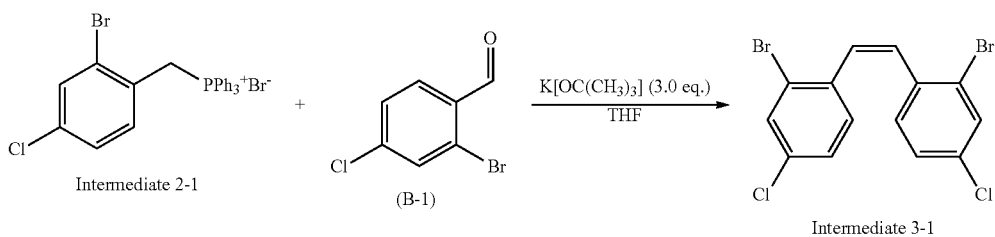
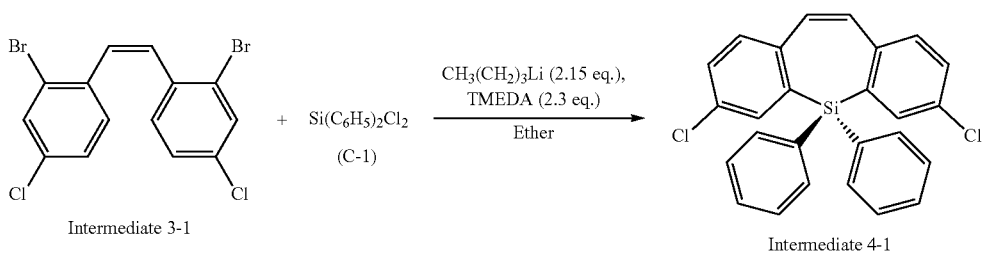
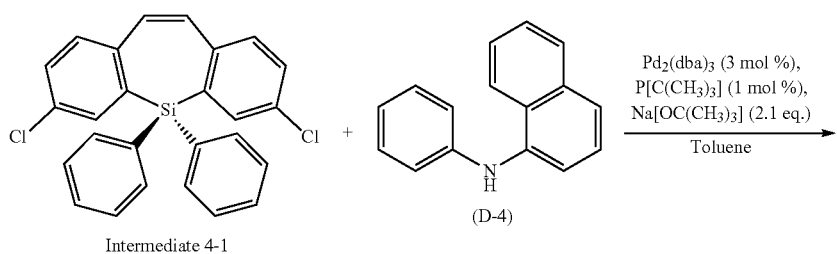

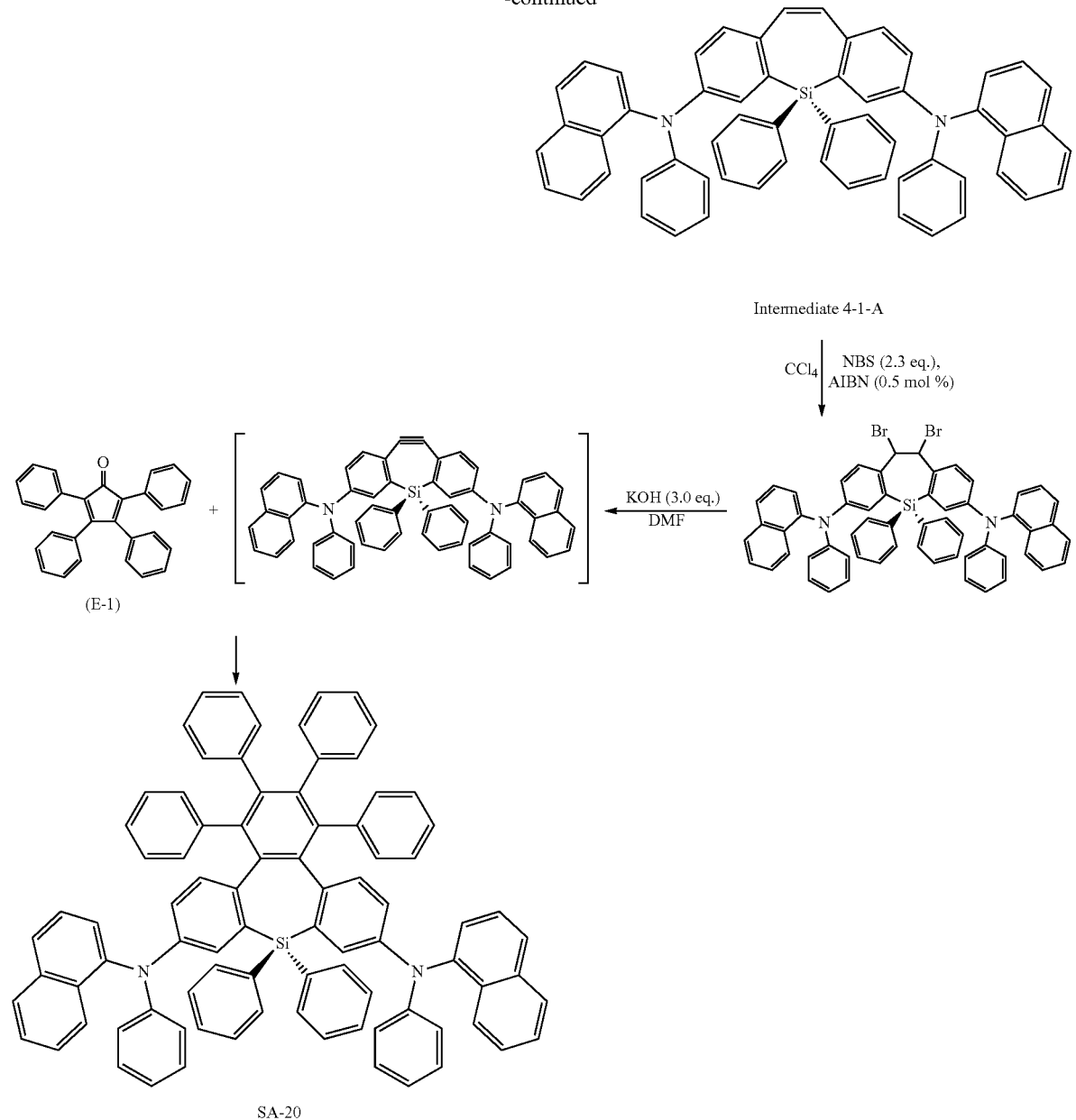

Intermediate 4-1-A

SA-20

A preparation method of the dibenzoheterocyclic compound shown in the formula SA-20 includes the following steps:

1. Preparing an intermediate 4-1 by the synthesis method provided by the embodiment 1

2. Preparing the dibenzoheterocyclic compound having the structure as shown in formula SA-20:

(1) In a dry, nitrogen-flushed 100-ml double-neck round-bottom flask, equipped with a magnetic stirring bar and a reflux tube, the intermediate 4-1 (5.582 g, 1.0 equivalent), the compound shown in the formula D-4 (5.844 g, 2.05 equivalent), $Pd_2(dba)_3$ (0.275 g, 3 mol percent), potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain an intermediate 4-1-$A_1$ (9.716 g, yield: 94%).

(2) In a dry, nitrogen-flushed 100-ml double-neck round-bottom flask, equipped with a magnetic stirring bar and a reflux tube, the intermediate 4-1-$A_1$ (5.566 g, 1.0 equivalent), NBS (2.865 g, 2.3 equivalent), AIBN (0.006 g, 0.5 mol percent), and carbon tetrachloride (50 ml) were respectively added firstly, the mixture was stirred for 10 minutes, and finally, the mixture was heated refluxly for 24 hours; after reaction, water (20 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/30) to obtain an intermediate 5-1 (5.080 g, yield: 76%).

(3) In a dry, nitrogen-flushed 100-ml double-neck round-bottom flask, equipped with a magnetic stirring bar and a reflux tube, the intermediate 5-1 (4.774 g, 1.0 equivalent), potassium hydroxide (0.842 g, 3.0 equivalent), and 1,2-dimethoxyethane (50 ml) were respectively added firstly, the mixture was stirred for 10 minutes, and finally, the mixture was heated refluxly for 4 hours; after reaction, 2,3,4,5-tetraphenylcyclopenta-2,4-dien-1-one (a compound shown in the formula E-1) (3.460 g, 1.8 equivalent), and then, the mixture was heated refluxly for 12 hours; after the temperature returns, water (20 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/30) to obtain the compound SA-20 (2.816 g, total yield: 49%).

Elemental analysis: ($C_{86}H_{60}N_2Si$) theoretical values: C, 89.86; H, 5.26; N, 2.44; measured values: C, 89.89; H, 5.23; N, 2.43; HRMS (ESI) m/z (M$^+$): theoretical value: 1148.4526; measured value: 1148.4521.

Embodiment 9

This embodiment provides a dibenzoheterocyclic compound having a structure as shown in the formula SA-24 below:

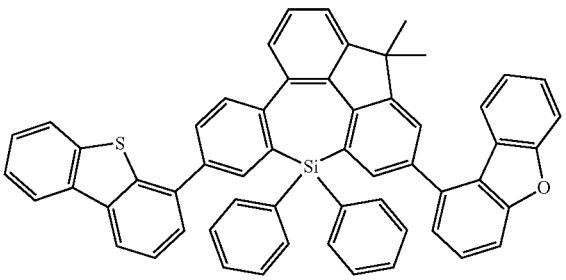

SA-24

A synthesis route of the dibenzoheterocyclic compound shown in the formula SA-24 is as shown below:

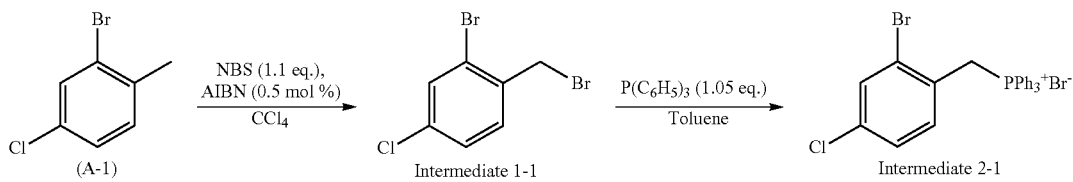

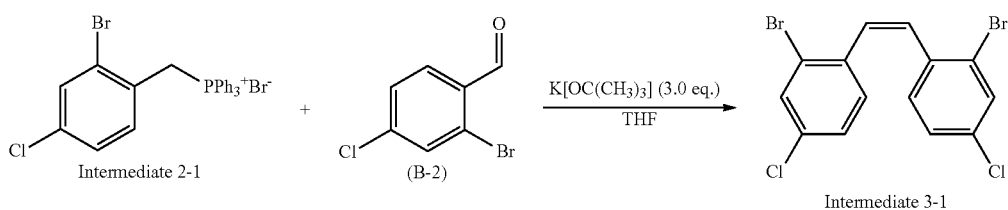

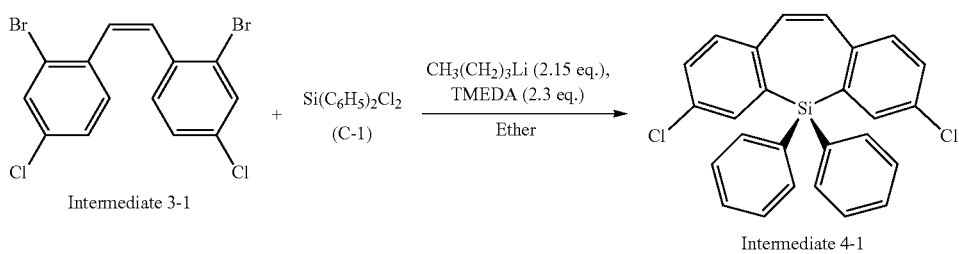

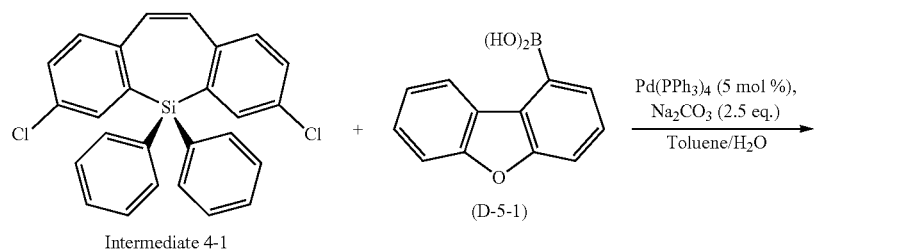

-continued
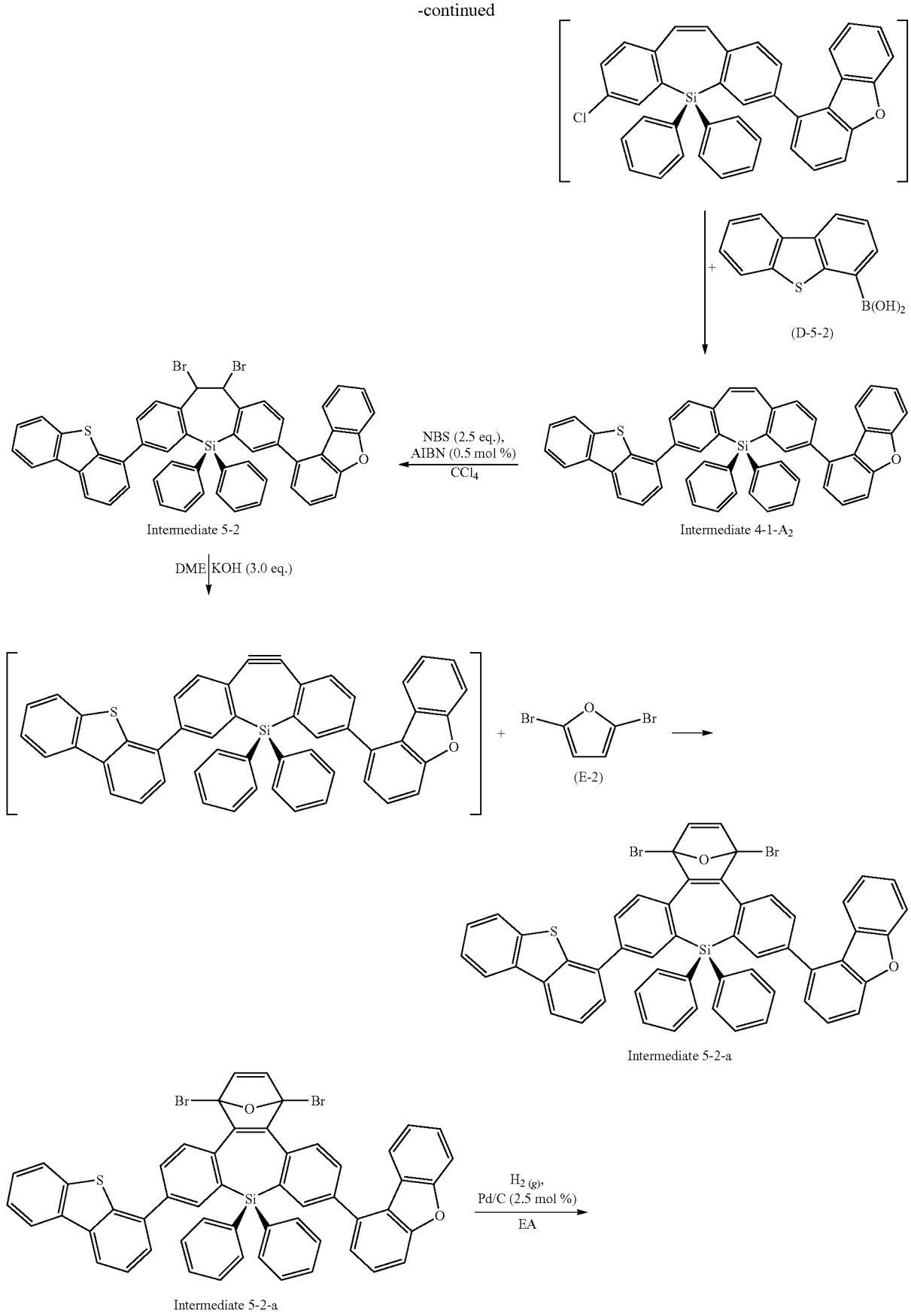

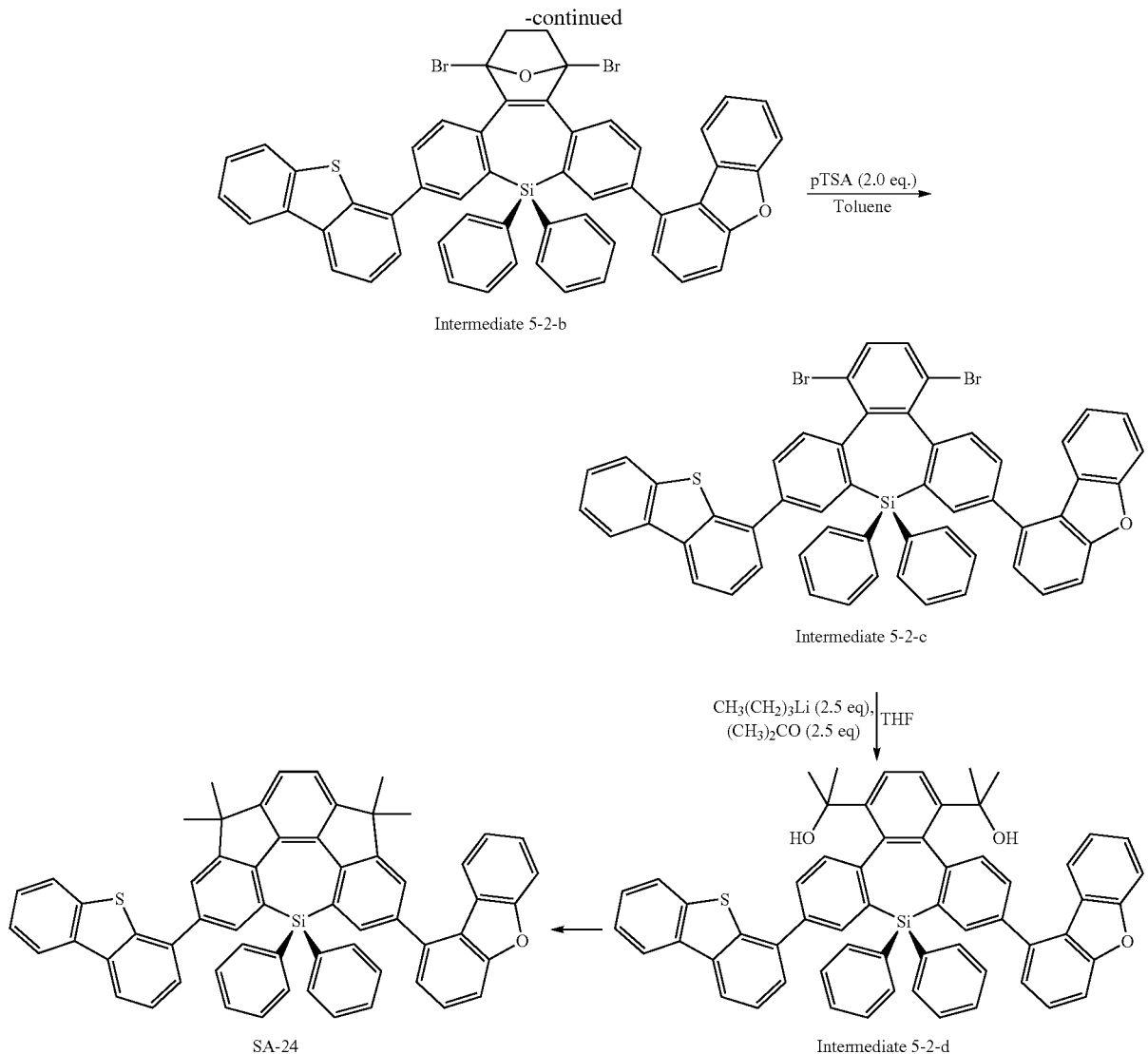

A preparation method of the dibenzoheterocyclic compound shown in the formula SA-24 includes the following steps:

1. Preparing an intermediate 4-1 by the synthesis method provided by the embodiment 1

2. Preparing the dibenzoheterocyclic compound shown in the formula SA-24:

(1) In a dry, nitrogen-flushed 100-ml double-neck round-bottom flask, equipped with a magnetic stirring bar and a reflux tube, the intermediate 4-1 (5.582 g, 1.0 equivalent), dibenzofuran-1-boric acid (a compound shown in the formula D-5-1) (2.894 g, 1.05 equivalent), Pd(PPh$_3$)$_4$ (0.578 g, 5 mol percent), sodium carbonate (2.649 g, 2.5 equivalent), toluene (40 ml) and water (4 ml) were respectively added firstly, the mixture was stirred for 10 minutes, and finally, the mixture was heated refluxly for 18 hours; after reaction, dibenzothiophene-4-boric acid (a compound shown in the formula D-5-2) (3.113 g, 1.05 equivalent), and then, the mixture was heated refluxly for 12 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain an intermediate 4-1-A$_2$ (6.175 g, total yield: 67%);

(2) In a dry, nitrogen-flushed 100-ml double-neck round-bottom flask, equipped with a magnetic stirring bar and a reflux tube, the intermediate 4-1-A$_2$ (4.963 g, 1.0 equivalent), NBS (3.115 g, 2.5 equivalent), AIBN (0.006 g, 0.5 mol percent), and carbon tetrachloride (50 ml) were respectively added firstly, the mixture was stirred for 10 minutes, and finally, the mixture was heated refluxly for 24 hours; after reaction, water (20 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/30) to obtain an intermediate 5-2 (5.047 g, yield: 83%).

(3) In a dry, nitrogen-flushed 100-ml double-neck round-bottom flask, equipped with a magnetic stirring bar and a reflux tube, the intermediate 5-2 (4.344 g, 1.0 equivalent), potassium hydroxide (0.842 g, 3.0 equivalent), and 1,2- dimethoxyethane (50 ml) were respectively added firstly, the mixture was stirred for 10 minutes, and finally, the mixture was heated refluxly for 4 hours; after reaction, 2,4-dibromofuran (a compound shown in the formula E-2) (2.033 g, 1.8 equivalent), and then, the mixture was heated refluxly for 12 hours; after reaction, water (20 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/30) to obtain an intermediate 5-2-a (1.912 g, total yield: 41%).

(4) In a dry, nitrogen-flushed 50-ml double-neck round-bottom flask, equipped with a magnetic stirring bar, the intermediate 5-2-a (1.866 g, 1.0 equivalent), activated carbon supported palladium (5%, 0.106 g, 2.5 mol percent), and ethyl acetate (20 ml) were respectively added the mixture was stirred for 10 minutes, and finally, filling with hydrogen gas and the reaction was stirred for 8 hours at room temperature; water (15 ml) was added. After extraction with ethyl acetate (3*15 ml), the combined extraction liquids were dried over magnesium sulfate, filtered, and concentrated under vacuum. The crude product was purified by means of column chromatography (ethyl acetate/hexane, 1/30) to obtain an intermediate 5-2-b (1.776 g, yield: 95%).

(5) In a dry, nitrogen-flushed 50-ml double-neck round-bottom flask, equipped with a magnetic stirring bar, the intermediate 5-2-b (1.500 g, 1.0 equivalent), p-toluenesulfonic acid (0.552 g, 2.0 equivalent), and toluene (15 ml) were respectively added firstly, the mixture was stirred for 10 minutes, and finally, the mixture was heated refluxly for 16 hours; water (10 ml) was added. After extraction with ethyl acetate (3*10 ml), the combined extraction liquids were dried over magnesium sulfate, filtered, and concentrated under vacuum. The crude product was purified by means of column chromatography (ethyl acetate/hexane, 1/30) to obtain an intermediate 5-2-c (1.441 g, yield: 98%).

(6) In a dry, nitrogen-flushed 50-ml double-neck round-bottom flask, equipped with a magnetic stirring bar, the intermediate 5-2-c (1.200 g, 1.0 equivalent) and anhydrous tetrahydrofuran (20 ml) were added, the mixture was stirred for 10 minutes at −78° C., subsequently, 2.5 M butyl lithium dissolved in hexane (1.31 ml, 2.5 equivalent) was added dropwise and the reaction was stirred for 30 minutes, and anhydrous acetone (0.24 ml, 2.5 equivalent) was added dropwise and the reaction was stirred for 2 hours; after reaction, a saturated sodium bicarbonate aqueous solution (10 ml) was added to quench the reaction. After extraction with ethyl acetate (3*15 ml), the combined extraction liquids were dried over magnesium sulfate, filtered, and concentrated under vacuum. The crude product was purified by means of column chromatography (ethyl acetate/hexane, 1/15) to obtain an intermediate 5-2-d (0.974 g, yield: 85%).

(7) In a dry, nitrogen-flushed 25-ml double-neck round-bottom flask, equipped with a magnetic stirring bar, the intermediate 5-2-d (0.875 g, 1.0 equivalent) and anhydrous dichloromethane (10 ml) were added, the mixture was stirred for 10 minutes at 0° C., and subsequently, boron trifluoride diethyl ether (0.49 ml, 4.0 equivalent) was added dropwise and the reaction was stirred for 2 hours at room temperature; after reaction, a saturated sodium bicarbonate aqueous solution (10 ml) was added to quench the reaction. After extraction with ethyl acetate (3*15 ml), the combined extraction liquids were dried over magnesium sulfate, filtered, and concentrated under vacuum. The crude product was purified by means of column chromatography (ethyl acetate/hexane, 1/25) to obtain the compound SA-24 (0.780 g, yield: 93%).

Elemental analysis: ($C_{60}H_{42}OSSi$) theoretical values: C, 85.88; H, 5.05; O, 1.91; S, 3.82: measured values: C, 85.85; H, 5.07; O, 1.94; S, 3.83; HRMS (ESI) m/z ($M^+$): theoretical value: 838.2726; measured value: 838.2732.

Embodiment 10

This embodiment provides a dibenzoheterocyclic compound having a structure as shown in the formula SA-26 below:

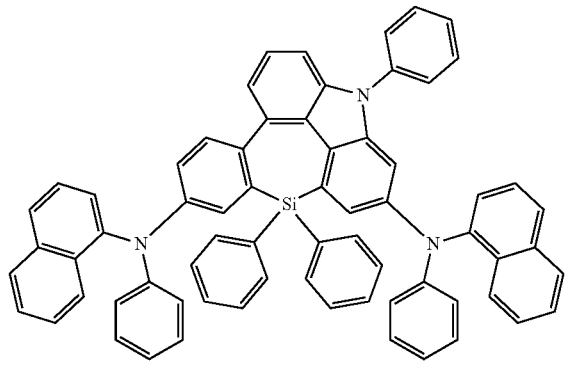

SA-26

A synthesis route of the dibenzoheterocyclic compound shown in the formula SA-26 is as shown below:

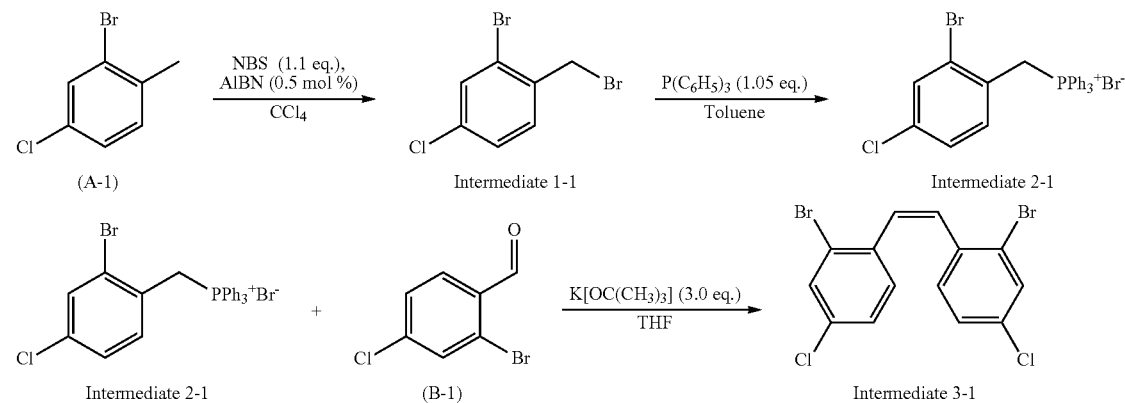

-continued
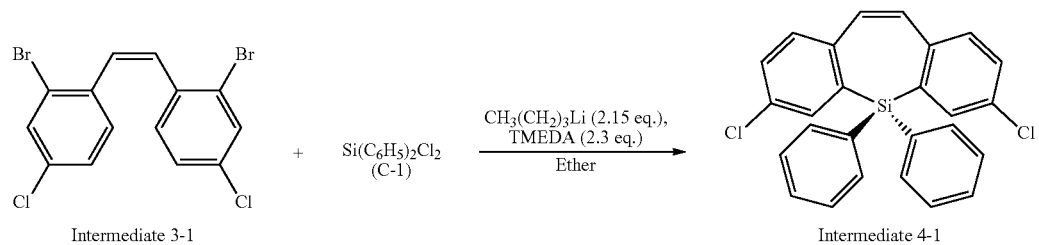
Intermediate 3-1 + Si(C₆H₅)₂Cl₂ (C-1) → Intermediate 4-1
CH₃(CH₂)₃Li (2.15 eq.), TMEDA (2.3 eq.)
Ether
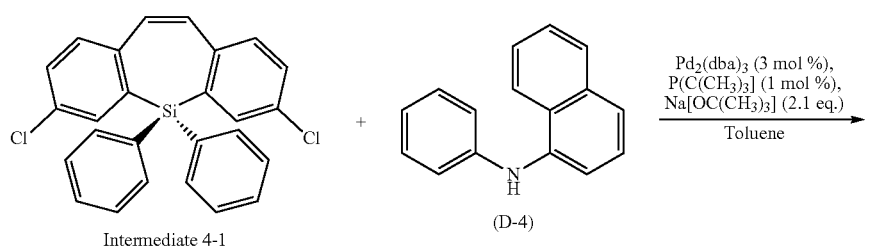
Intermediate 4-1 + (D-4) →
Pd₂(dba)₃ (3 mol %), P(C(CH₃)₃] (1 mol %), Na[OC(CH₃)₃] (2.1 eq.)
Toluene
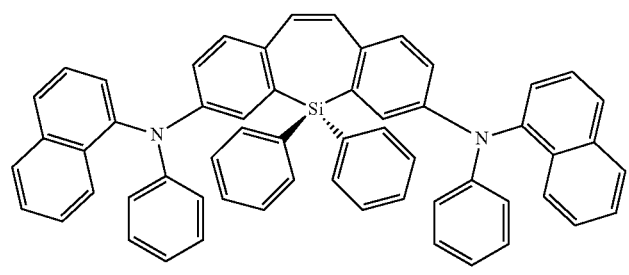
Intermediate 4-1-A₁
$$\xrightarrow[CCl_4]{NBS\ (2.3\ eq.),\ AIBN\ (0.5\ mol\ \%)}$$
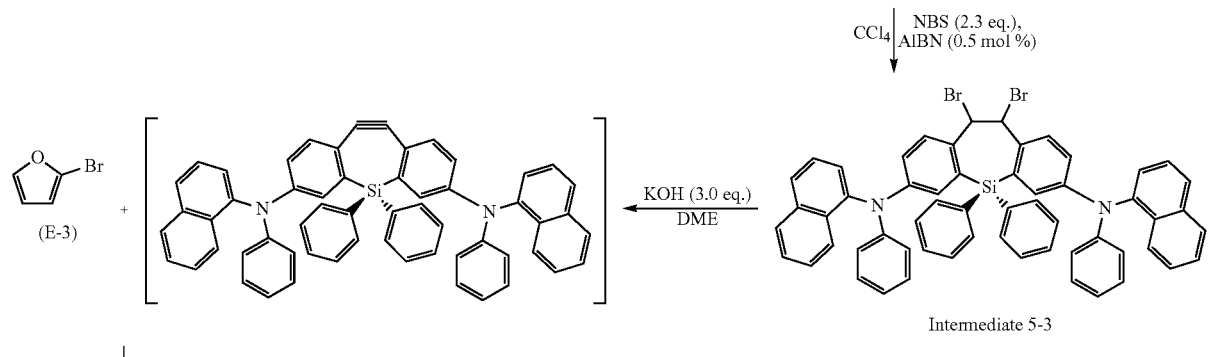
Intermediate 5-3
(E-3) + [ ] $\xleftarrow{\text{KOH (3.0 eq.)}}{\text{DME}}$
Intermediate 5-3-a
$\xrightarrow{\text{H}_2\ (g),\ \text{Pd/C (2.5 mol \%)}}{\text{EA}}$

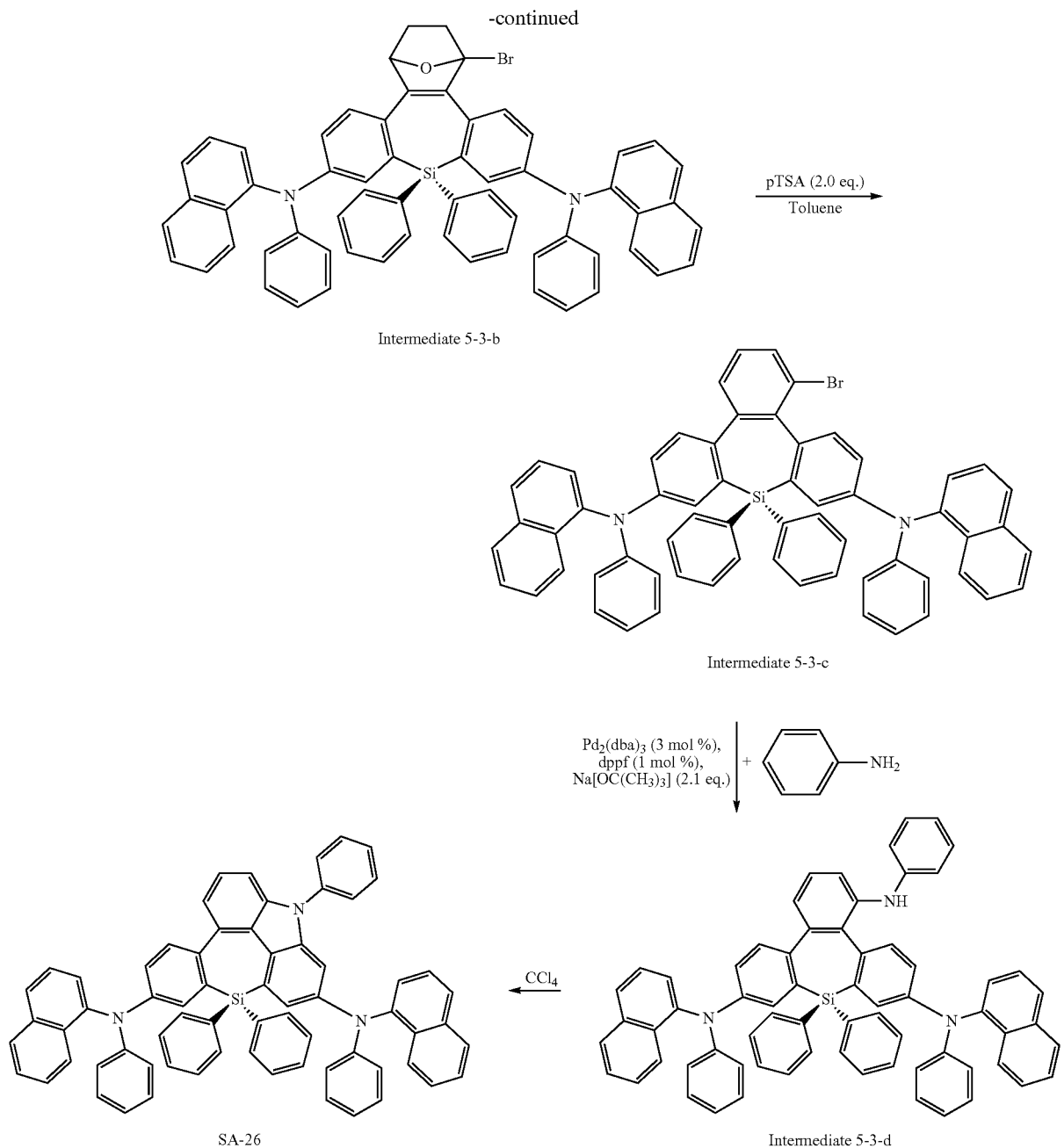

Intermediate 5-3-b

Intermediate 5-3-c

Intermediate 5-3-d

SA-26

A preparation method of the dibenzoheterocyclic compound shown in the formula SA-26 includes the following steps:

1. Preparing an intermediate 4-1 by the synthesis method provided by the embodiment 1.

2. Preparing the dibenzoheterocyclic compound shown in the formula SA-26:

(1) In a dry, nitrogen-flushed 100-ml double-neck round-bottom flask, equipped with a magnetic stirring bar and a reflux tube, the intermediate 4-1 (5.582 g, 1.0 equivalent), the compound shown in the formula D-4 (5.844 g, 2.05 equivalent), Pd$_2$(dba)$_3$ (0.275 g, 3 mol percent), potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain an intermediate 4-1-A$_1$ (9.716 g, yield: 94%).

(2) In a dry, nitrogen-flushed 100-ml double-neck round-bottom flask, equipped with a magnetic stirring bar and a reflux tube, the intermediate 4-1-A$_2$ (4.963 g, 1.0 equivalent), NBS (3.115 g, 2.5 equivalent), AIBN (0.006 g, 0.5 mol percent), and carbon tetrachloride (50 ml) were respectively added firstly, the mixture was stirred for 10 minutes, and finally, the mixture was heated refluxly for 24 hours; after reaction, water (20 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/30) to obtain an intermediate 5-3 (the intermediate 5-2 is the same as the intermediate 5-1 in the embodiment 8) (5.047 g, yield: 83%).

(3) In a dry, nitrogen-flushed 100-ml double-neck round-bottom flask, equipped with a magnetic stirring bar and a reflux tube, the intermediate 5-3 (4.774 g, 1.0 equivalent), potassium hydroxide (0.842 g, 3.0 equivalent), and 1,2-dimethoxyethane (50 ml) were respectively added firstly, the mixture was stirred for 10 minutes, and finally, the mixture was heated refluxly for 4 hours; after reaction, 2-bromofuran (a compound shown in the formula E-3) (1.323 g, 1.8 equivalent), and then, the mixture was heated refluxly for 12 hours; after reaction, water (20 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/30) to obtain an intermediate 5-3-a (2.021 g, total yield: 43%).

(4) In a dry, nitrogen-flushed 50-ml double-neck round-bottom flask, equipped with a magnetic stirring bar, the intermediate 5-3-a (1.880 g, 1.0 equivalent), activated carbon supported palladium (5%, 0.106 g, 2.5 mol percent), and ethyl acetate (20 ml) were respectively added firstly, the mixture was stirred for 10 minutes, and finally, filling with hydrogen gas and the reaction was stirred for 8 hours at room temperature; water (15 ml) was added. After extraction with ethyl acetate (3*15 ml), the combined extraction liquids were dried over magnesium sulfate, filtered, and concentrated under vacuum. The crude product was purified by means of column chromatography (ethyl acetate/hexane, 1/30) to obtain an intermediate 5-3-b (1.733 g, yield: 92%).

(5) In a dry, nitrogen-flushed 50-ml double-neck round-bottom flask, equipped with a magnetic stirring bar and a reflux tube, the intermediate 5-3-b (1.500 g, 1.0 equivalent), p-toluenesulfonic acid (0.548 g, 2.0 equivalent), and toluene (15 ml) were respectively added firstly, the mixture was stirred for 10 minutes, and finally, the mixture was heated refluxly for 16 hours; water (10 ml) was added. After extraction with ethyl acetate (3*10 ml), the combined extraction liquids were dried over magnesium sulfate, filtered, and concentrated under vacuum. The crude product was purified by means of column chromatography (ethyl acetate/hexane, 1/30) to obtain an intermediate 5-3-c (1.457 g, yield: 99%).

(6) In a dry, nitrogen-flushed 50-ml double-neck round-bottom flask, equipped with a magnetic stirring bar and a reflux tube, the intermediate 5-3-c (1.300 g, 1.0 equivalent), aniline (0.38 ml, 3.0 equivalent), $Pd_2(dba)_3$ (0.039 g, 3 mol percent), dppf (0.006 g, 1 mol percent), potassium tert-butoxide (0.215 g, 2.1 equivalent), and anhydrous toluene (15 ml) were respectively added firstly, the mixture was stirred for 10 minutes, and finally, the mixture was heated refluxly for 6 hours; after reaction, water (10 ml) was added to quench the reaction. After extraction with ethyl acetate (3*15 ml), the combined extraction liquids were dried over magnesium sulfate, filtered, and concentrated under vacuum. The crude product was purified by means of column chromatography (ethyl acetate/hexane, 1/15) to obtain an intermediate 5-3-d (0.941 g, yield: 94%).

(7) In a dry, nitrogen-flushed 25-ml double-neck round-bottom flask, equipped with a magnetic stirring bar, the intermediate 5-3-d (0.936 g, 1.0 equivalent) and carbon tetrachloride (10 ml) were added firstly, the mixture was stirred for 10 minutes, and finally, irradiating the mixture for 72 hours by using an ultraviolet lamp; after reaction, water (10 ml) was added to quench the reaction. After extraction with ethyl acetate (3*15 ml), the combined extraction liquids were dried over magnesium sulfate, filtered, and concentrated under vacuum. The crude product was purified by means of column chromatography (ethyl acetate/hexane, 1/30) to obtain the compound SA-26 (0.617 g, yield: 66%).

Elemental analysis: ($C_{68}H_{47}N_3Si$) theoretical values: C, 87.42; H, 5.07; N, 4.50; measured values: C, 87.45; H, 5.04; N, 4.52; HRMS (ESI) m/z ($M^+$): theoretical value: 933.3539; measured value: 933.3532.

Embodiment 11

This embodiment provides a dibenzoheterocyclic compound having a structure as shown in the formula SA-34 below:

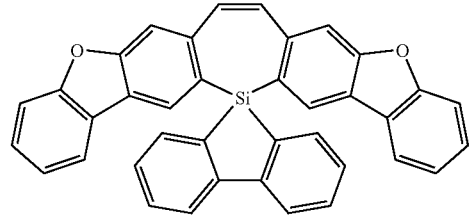

SA-34

A synthesis route of the dibenzoheterocyclic compound shown in the formula SA-34 is as shown below:

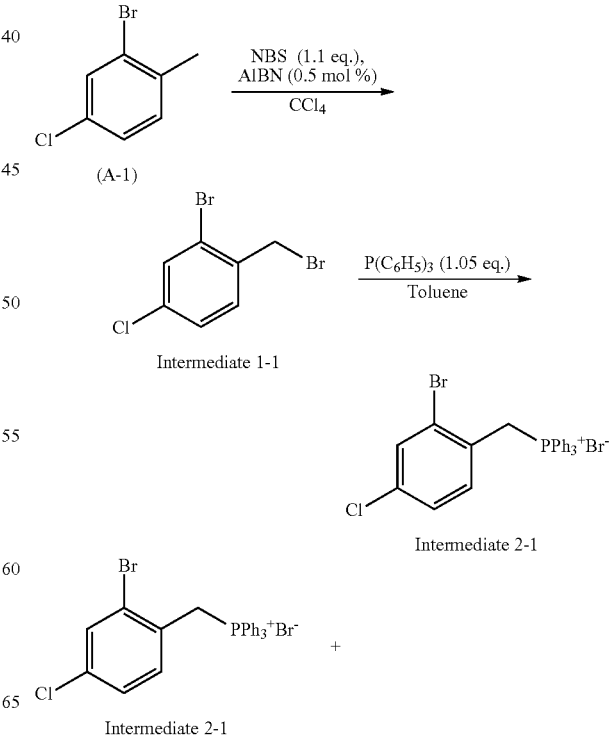

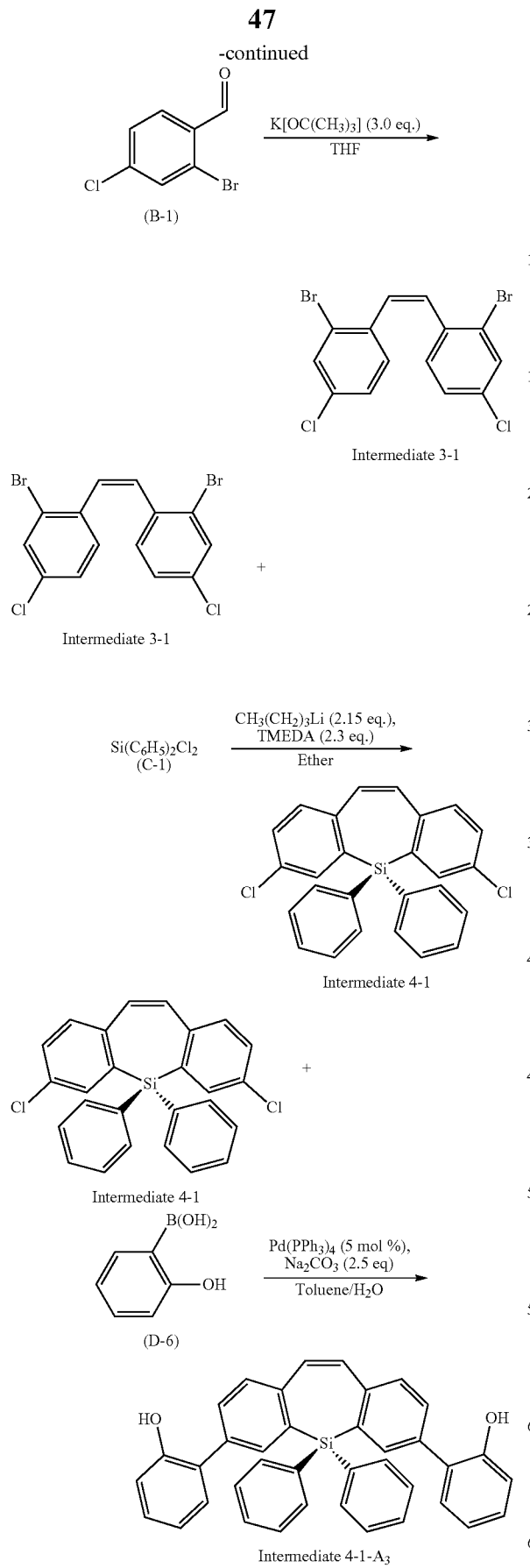

A preparation method of the dibenzoheterocyclic compound shown in the formula SA-34 includes the following steps:

1. Preparing an intermediate 4-1 by the synthesis method provided by the embodiment 1.

2. Preparing the dibenzoheterocyclic compound shown in the formula SA-34:

(1) In a dry, nitrogen-flushed 250-ml double-neck round-bottom flask, equipped with a magnetic stirring bar and a reflux tube, the intermediate 4-1 (5.582 g, 1.0 equivalent), 2-hydroxy-phenylboric acid (a compound shown in the formula D-6) (2.894 g, 2.3 equivalent), $Pd(PPh_3)_4$ (0.578 g, 5 mol percent), sodium carbonate (2.649 g, 2.5 equivalent), toluene (120 ml) and water (12 ml) were respectively added firstly, the mixture was stirred for 10 minutes, and finally, the mixture was heated refluxly for 18 hours; after reaction, water (70 ml) was added to quench the reaction. After extraction with ethyl acetate (3*100 ml), the combined extraction liquids were dried over magnesium sulfate, filtered, and concentrated under vacuum. The crude product was purified by means of column chromatography (ethyl acetate/hexane, 1/15) to obtain an intermediate 4-1-$A_3$ (6.161 g, total yield: 87%).

(2) In a dry, nitrogen-flushed 250-ml double-neck round-bottom flask, equipped with a magnetic stirring bar, the intermediate 4-1-$A_3$ (5.447 g, 1.0 equivalent) and anhydrous dichloromethane (100 ml) were added firstly, the mixture was stirred for 10 minutes at 0° C., and subsequently, boron trifluoride diethyl ether (6.17 ml, 5.0 equivalent) was added dropwise and the reaction was stirred for 2 hours at room temperature; after reaction, a saturated sodium bicarbonate aqueous solution (100 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/25) to obtain the compound SA-34 (5.137 g, yield: 95%).

Elemental analysis: ($C_{38}H_{24}O_2Si$) theoretical values: C, 84.41; H, 4.47; O, 5.92; measured values: C, 84.42; H, 4.43; O, 5.95; HRMS (E) m/z ($M^+$): theoretical value: 540.1546; measured value: 540.1548.

Embodiment 12

This embodiment provides a dibenzoheterocyclic compound having a structure as shown in the formula SA-45 below:

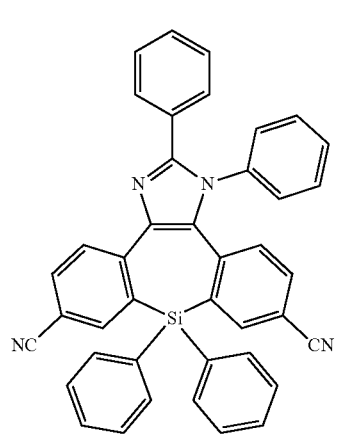
SA-45
A synthesis route of the dibenzoheterocyclic compound shown in the formula SA-45 is as shown below:
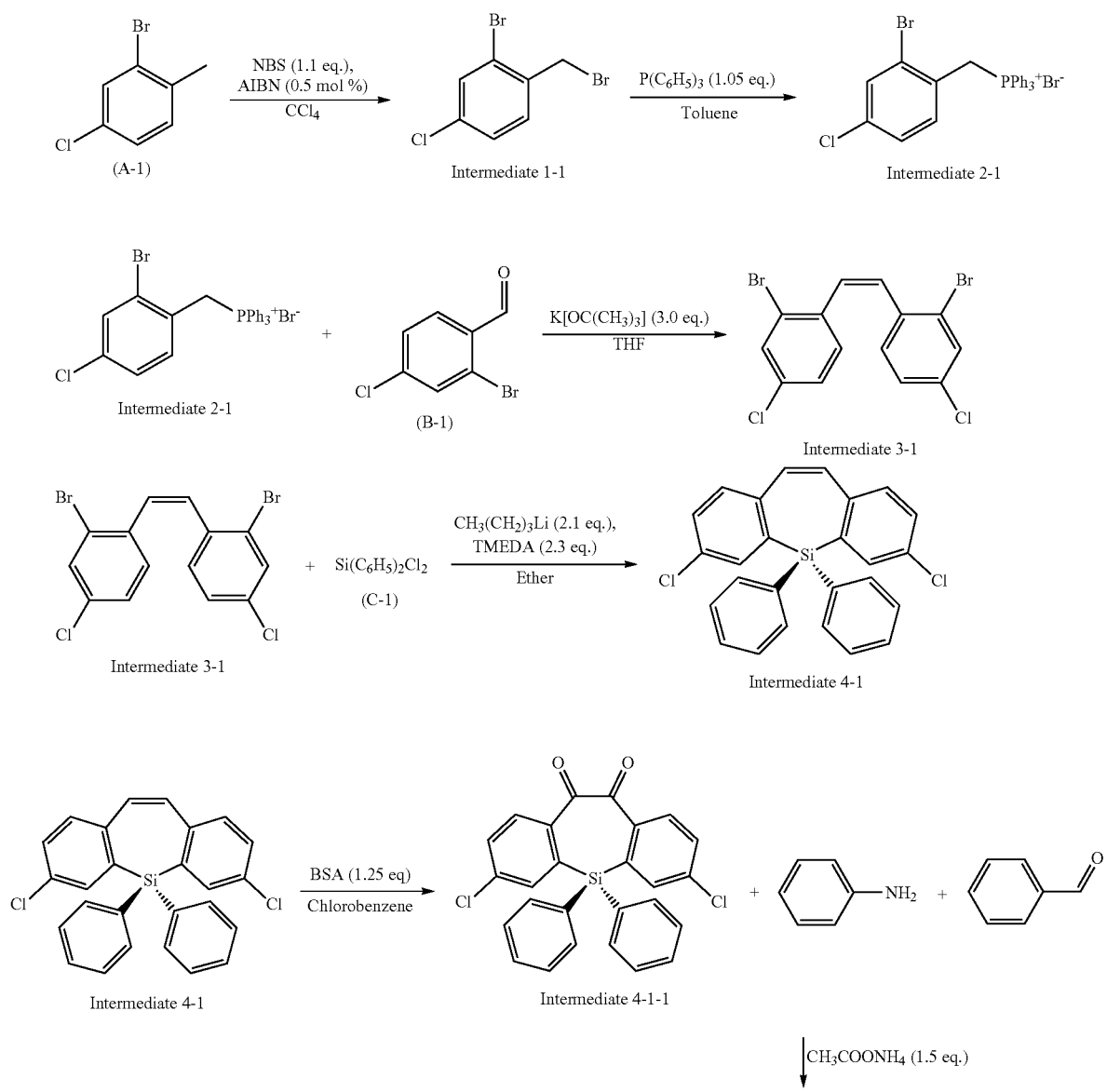

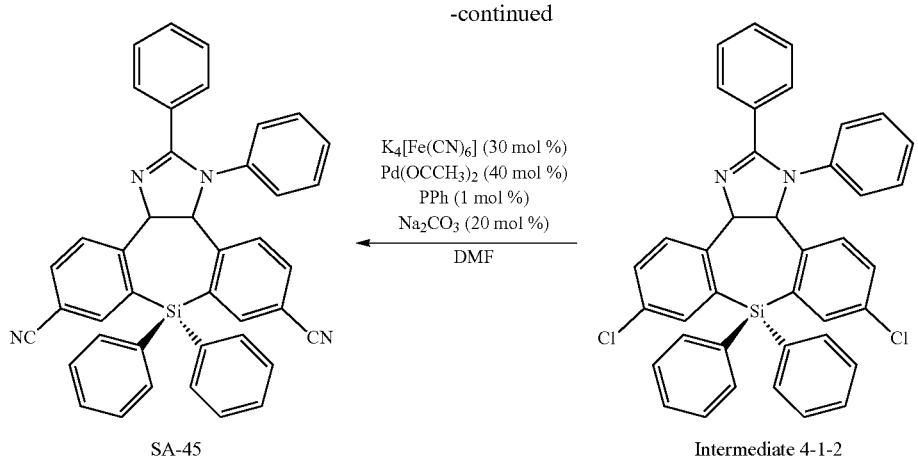

SA-45 ← K₄[Fe(CN)₆] (30 mol %) / Pd(OCCH₃)₂ (40 mol %) / PPh (1 mol %) / Na₂CO₃ (20 mol %) / DMF — Intermediate 4-1-2

A preparation method of the dibenzoheterocyclic compound shown in the formula SA-45 includes the following steps:

1. Preparing an intermediate 4-1 by the synthesis method provided by the embodiment 1
2. Preparing the dibenzoheterocyclic compound having the structure as shown in formula SA-45:

(1) In a dry, nitrogen-flushed 250-ml double-neck round-bottom flask, equipped with a magnetic stirring bar and a reflux tube, the intermediate 4-1 (5.582 g, 1.0 equivalent), benzeneseleninic acid anhydride (5.852 g, 1.25 equivalent), and chlorobenzene (120 ml) were respectively added firstly, the mixture was stirred for 10 minutes, and finally, the mixture was heated refluxly for 18 hours; and after reaction, reducing the temperature of a reaction solution to 0° C. and the mixture was filtered, then, the obtained solid was cleaned with hexane (3*80 ml), and a crude product was recrystallized with dichloromethane to obtain an intermediate 4-1-1 (4.957 g, yield: 83%).

(2) In a dry, nitrogen-flushed 250-ml double-neck round-bottom flask, equipped with a magnetic stirring bar and a reflux tube, aniline (0.91 ml, 1.0 equivalent), benzaldehyde (1.06 ml, 1.05 equivalent), and ethanol (100 ml) were respectively added firstly, the mixture was stirred for 10 hours, subsequently, 7.5 M ammonium acetate was added to an aqueous solution (2.0 ml, 1.5 equivalent) the mixture was stirred for 10 minutes, and finally, the mixture was heated refluxly for 6 hours; after reaction, water (30 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/25) to obtain an intermediate 4-1-2 (3.492 g, yield: 56%).

(3) In a dry, nitrogen-flushed 100-ml double-neck round-bottom flask, equipped with a magnetic stirring bar and a reflux tube, the intermediate 4-1-2 (3.118 g, 1.0 equivalent), K₄[Fe(CN)₆] (0.634 g, 30 mol percent), palladium acetate (0.449 g, 40 mol percent), triphenylphosphine (0.131 g, 10 mol percent), sodium carbonate (0.106 g, 20 mol percent), and N,N-dimethyl formamide (30 ml) were respectively added firstly, the mixture was stirred for 10 minutes, and finally, the mixture was heated refluxly for 16 hours; after reaction, water (20 ml) was added to quench the reaction. After extraction with ethyl acetate (3*25 ml), the combined extraction liquids were dried over magnesium sulfate, filtered, and concentrated under vacuum. The crude product was purified by means of column chromatography (ethyl acetate/hexane, 1/25) to obtain the compound SA-45 (2.177 g, yield: 72%).

Elemental analysis: ($C_{41}H_{28}N_4Si$) theoretical values: C, 81.43; H, 4.67; N, 9.26; Si; measured values: C, 81.43; H, 4.64; N, 9.28; HRMS (ESI) m/z ($M^+$): theoretical value: 604.2083; measured value: 604.2088.

Embodiment 13

This embodiment provides an organic light-emitting device. As shown in FIG. 1, the organic light-emitting device includes an anode 1, a hole injection layer 2, a hole transport layer 3, a light-emitting layer 4, an electron transport layer 5, an electron injection layer 6 and a cathode 7 which are sequentially stacked on a substrate.

In the organic light-emitting device, the anode is made from an ITO material; the cathode 7 is made from metal Al;

the hole injection layer 2 is made from PEDOT:PSS, and the PEDOT:PSS has a chemical structure as shown below:

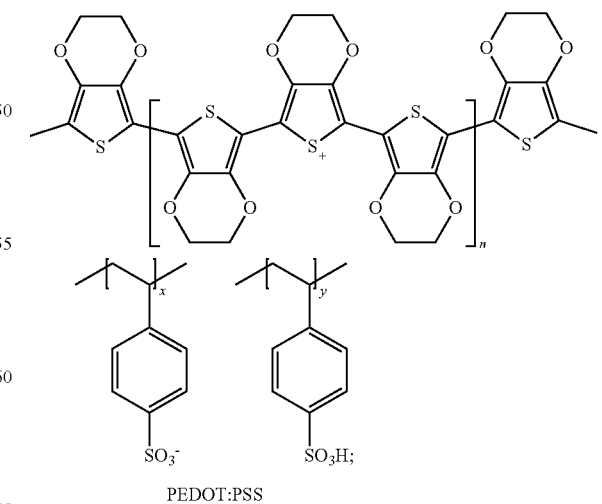

PEDOT:PSS the hole transport layer 3 is made from NPB, and the NPB has a chemical structure as shown below:

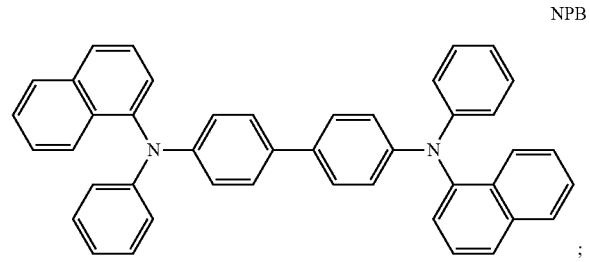 [SMILES: c1ccc(N(c2ccc(-c3ccc(N(c4ccccc4)c4cccc5ccccc45)cc3)cc2)c2cccc3ccccc23)cc1]

NPB

;

the electron transport layer 5 is made from TPBI, and the TPBI has a chemical structure as shown below:

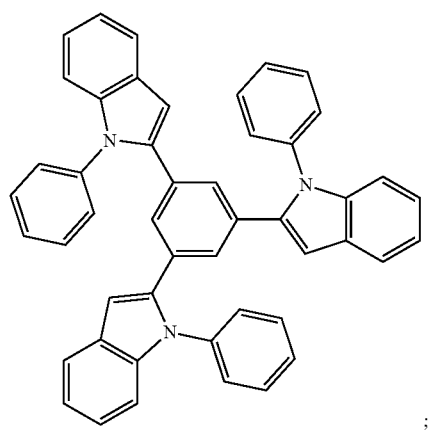

TPBI

;

the electron injection layer 6 is formed by doping TPBI with an electron injection material LiF;

a light-emitting material of the light-emitting layer 32 in the OLED is selected from the dibenzoheterocyclic compound shown in the formula SA-08:

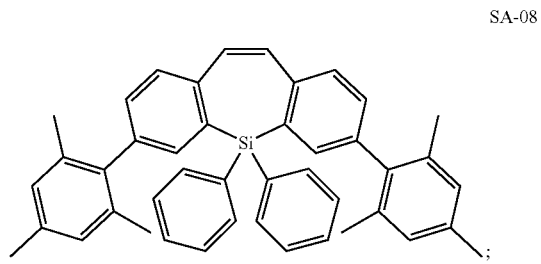

SA-08

;

the organic light-emitting device forms the following specific structure: ITO (anode)/PEDOT:PSS (hole injection layer, 30 nm)/NPB (hole transport layer, 40 nm)/SA-08 (light-emitting layer, 40 nm)/TPBI (electron transport layer, 40 nm)/TPBI: LiF (electron injection layer, 1 nm) aluminum (cathode, 150 nm).

The light-emitting layer material is selected from the dibenzoheterocyclic compound SA-08, and $Ar^1$ and $Ar^2$ substituent groups in the compound SA-08 are phenyl groups, so that the compound SA-08 has a wide energy level band gap ($E_g$=4.44 eV), deep blue light can be emitted (CIE, y<0.1), and a deep blue light-emitting device can be obtained. Because of the existence of the diphenyl ethylene group in the mother nucleus structure of the SA-08, the compound SA-08 has a low LUMO level (−1.52 eV), thereby being favorable for matching the energy level of the electron transport layer, and promoting injection and transport of electrons. Meanwhile, the dibenzoheterocyclic compound SA-08 is connected with a substituent group

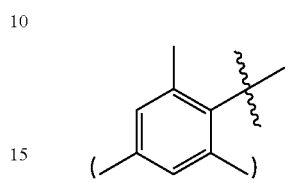

of an electron donor and two phenyl groups connected to the Si atom, material molecules have good hole transport performance, and the HOMO energy level is suitable for matching an adjacent hole transport layer, thereby being favorable for balancing electrons and holes in the light-emitting layer, increasing the combination probability of electrons and holes, and improving the blue light-emitting efficiency of the OLED. The spatial configuration of the dibenzoheterocyclic compound SA-08 is a butterfly configuration, thereby avoiding the generation of high energy excitons caused by stacking of the material molecules, effectively reducing the annihilation of the excitons in the light-emitting layer, avoiding the efficiency roll-off of the blue light-emitting device, preventing the deep blue color coordinate drift, and further obtaining the blue light-emitting device with high light-emitting stability. The HOMO energy level and the LUMO energy level of the dibenzoheterocyclic compound SA-08 are matched with the hole transport layer and the electron transport layer at two sides, thereby being favorable for lowering the potential barrier needing to be overcome by transporting electrons and holes to the light-emitting layer, and further lowering the working voltage of the device. On the other hand, the dibenzoheterocyclic compound shown in SA-08 has high thermal decomposition temperature, high thermal stability and morphological stability and excellent film-forming performance; the $Ar^1$ and $Ar^2$ substituent groups in the compound are phenyl groups, so that the rigidity of the compound SA-08 is enhanced, and the thermal stability of the compound SA-08 is further improved; and as a light-emitting layer material, the compound SA-08 is not easy to decompose and crystallize, thereby further improving the performance and the light-emitting efficiency of the OLED.

As an alternative embodiment, the guest light-emitting material of the light-emitting layer can also be selected from any dibenzoheterocyclic compound shown in the formula (SA-01) to the formula (SA-45).

As an alternative embodiment, the guest light-emitting material of the light-emitting layer can also be selected from any other dibenzoheterocyclic compound having a chemical structure shown in the general formula (I).

Embodiment 14

This embodiment provides an organic light-emitting device, which is different from the organic light-emitting device provided in the embodiment 13 only in that the light-emitting layer material is selected from the dibenzoheterocyclic compound having a structure shown below:

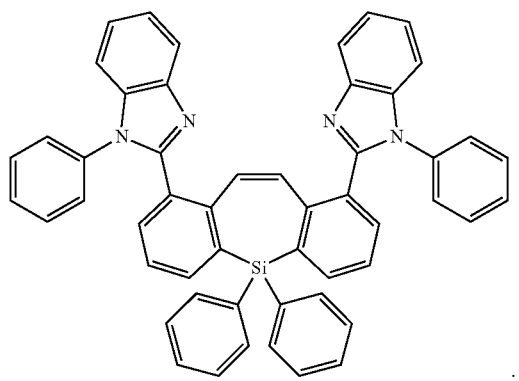

Embodiment 15

This embodiment provides an organic light-emitting device, which is different from the organic light-emitting device provided in the embodiment 13 only in that the light-emitting layer material is selected from the dibenzoheterocyclic compound having a structure shown below:

SA-24

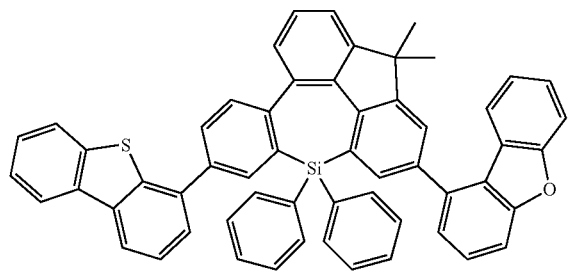

Embodiment 16

This embodiment provides an organic light-emitting device, which is different from the organic light-emitting device provided in the embodiment 13 only in that the light-emitting layer material is selected from the dibenzoheterocyclic compound having a structure shown below:

SA-34

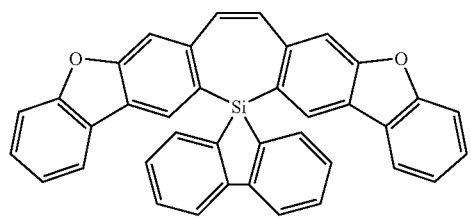

Embodiment 17

This embodiment provides an organic light-emitting device, which is different from the organic light-emitting device provided in the embodiment 13 only in that the light-emitting layer material is selected from the dibenzoheterocyclic compound having a structure shown below:

SA-45

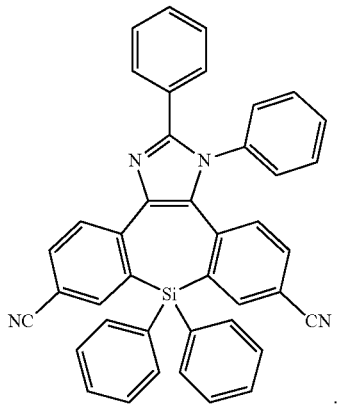

Contrast 1

This contrast provides an organic light-emitting device, which is different from the OLED provided in the embodiment 12 only in that the light-emitting layer material is selected from the compound having a structure shown below:

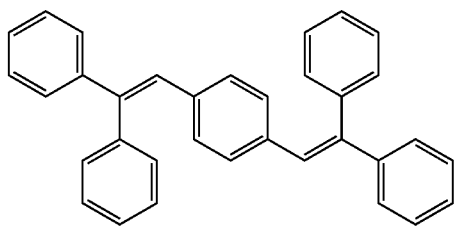

1,4-bis(2,2-diphenylvinyl)benzene

Test Case 1

1. Measurement of thermal decomposition temperature ($T_d$) of dibenzoheterocyclic compound A thermal gravimetric analyzer (TGA) is used for testing the thermal decomposition temperature of the material of the invention, the test range is from room temperature to 600° C., the heating rate is 10° C./min, and under the nitrogen atmosphere, the temperature with the weight loss of 0.5% is defined as the thermal decomposition temperature.

2. Measurement of HOMO energy level and LUMO energy level of dibenzoheterocyclic compound An electrochemical workstation is used for testing the HOMO and LUMO energy levels of the material of the invention through a cyclic voltammetry (CV), a platinum filament (PT) is used as a counter electrode, and silver/silver chloride (Ag/AgCl) is used as a reference electrode. Under the nitrogen atmosphere, a test is carried out in a dichloromethane electrolyte containing 0.1 M tetrabutylammonium hexafluorophosphate at a scanning rate of 100 mV/s, potential calibration is performed by ferrocene, and an absolute HOMO energy level of the potential of the ferrocene in a vacuum state is set to −4.8 eV:

HOMO=−$[E_{onset}^{ox}-E_{Fc/Fc+}+4.8]$eV;

LUMO=−$[E_{onset}^{red}-E_{Fc/Fc+}+4.8]$eV.

TABLE 1

| Compound | SA-08 | SA-11 | SA-24 | SA-26 | SA-34 | SA-45 |
|---|---|---|---|---|---|---|
| $T_d$ (° C.) | 456 | 469 | 471 | 477 | 464 | 461 |
| HOMO(eV) | −5.96 | −6.13 | −5.91 | −5.01 | −5.82 | −5.43 |
| LUMO(eV) | −1.52 | −1.58 | −1.63 | −1.49 | −1.92 | −2.01 |

According to the test data in the table 1, the dibenzoheterocyclic compound provided by the invention has high thermal decomposition temperature, and has higher thermal stability after film formation, material molecules are not easy to decompose or crystallize along with heat generated during the use of a device, the functions of a light-emitting layer can be kept stable, the breakdown of the device can be avoided, and the service life of the device can be prolonged. Meanwhile, the dibenzoheterocyclic compound has a low LUMO energy level (−1.49 to −1.92 eV), thereby being favorable for injecting and transporting electrons to the light-emitting layer and increasing the electron ratio. Because the hole transport performance of a semiconductor material is generally higher than the electron transport performance of the semiconductor material, the dibenzoheterocyclic compound is favorable for balancing electrons and holes, and the light-emitting efficiency of the device is improved. Because the band gap between the HOMO energy level and the LUMOenergy level of the dibenzoheterocyclic compound is wide (−3.52 to −4.55 eV), light can be emitted in a deep blue light-emitting region, and a deep blue light-emitting device can be obtained. Meanwhile, the dibenzoheterocyclic compound can serve as a host material of the light-emitting layer so as to perform efficient energy transfer to a guest light-emitting material.

Test Case 2

The properties, such as current, voltage, brightness and luminescent spectrum, of the organic light emitting diode provided by the embodiment 13 to the embodiment 17 and the contrast 1 are synchronously tested by adopting a PR 650 spectral scanning brightness meter and a Keithley K 2400 digital source meter system. Test results are as shown in table 2.

TABLE 2

| | Dibenzoheterocyclic compound | Voltage/V | Current density/ mA/cm$^2$ | Yield of external fluorescence quantums/% | Chroma/ CIE (X, Y) |
|---|---|---|---|---|---|
| Contrast 1 | | 7.8 | 20 | 4.35 | (0.15, 0.24) |
| Embodiment 13 | SA-08 | 4.9 | 20 | 6.70 | (0.14, 0.09) |
| Embodiment 14 | SA-11 | 4.7 | 20 | 5.92 | (0.14, 0.11) |
| Embodiment 15 | SA-24 | 4.5 | 20 | 6.94 | (0.15, 0.10) |
| Embodiment 16 | SA-34 | 4.4 | 20 | 6.01 | (0.15, 0.12) |
| Embodiment 17 | SA-45 | 4.5 | 20 | 5.54 | (0.15, 0.11) |

According to the table 2, as the light-emitting layer material, the dibenzoheterocyclic compound provided by the invention is favorable for lowering the working voltage of the device and improving the light-emitting efficiency of the device, and a deep blue light-emitting device which is high in yield of external quantums, capable of emitting light efficiently and stable in device performance can be obtained.

Obviously, the above embodiments are only used for clearly explaining examples but not limiting the embodiments. Other changes or modifications of different forms can also be made by those of ordinary skill in the art on the basis of the above illustration. There is no need and no way to exhaust all embodiments. Derived obvious changes or modifications are still within the protection scope of the invention.

What is claimed is:

1. A dibenzoheterocyclic compound, having a structure as shown in a formula (I):

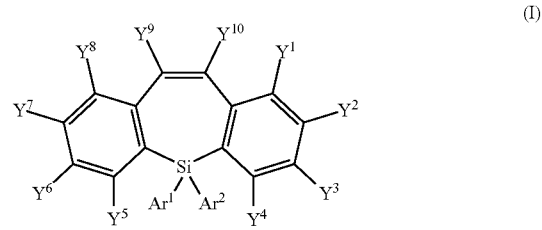

(I)

wherein Ar¹ and Ar² are, each independently, selected from unsubstituted $C_4$-$C_{60}$ aryl group;

$Y^1$-$Y^8$ are, each independently, selected from hydrogen, and cyano group, $Y^9$-$Y^{10}$ are bonded to form a ring $B^1$, and the ring $B^1$ is selected from substituted or unsubstituted imidazole ring.

2. The dibenzoheterocyclic compound according to claim 1, having a structure as shown below:

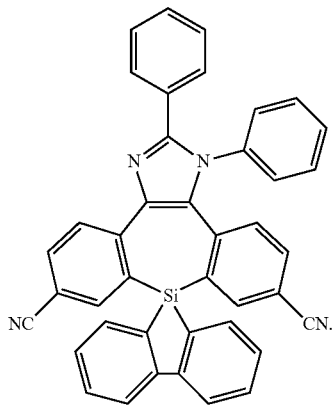

SA-45

3. A preparation method of the dibenzoheterocyclic compound according to claim 1, wherein
synthesis steps of the dibenzoheterocyclic compound shown in the formula (I) are as follows:
taking a compound shown in the formula (A) as a starting material, performing halogenating reaction under the action of a catalyst to obtain an intermediate 1, and enabling the intermediate 1 to react with triphenylphosphine to generate an intermediate 2; enabling the intermediate 2 and a compound shown in the formula (B) to be subjected to Wittig reaction to obtain an intermediate 3; enabling the intermediate 3 and a compound shown in the formula (C) to be subjected to condensation reaction to obtain an intermediate 4; enabling the intermediate 4 to react with a compound of at least one of $Y^1$-$Y^8$ to generate an intermediate 4-A;
when at least one of $Y^9$ and $Y^{10}$ is not hydrogen, enabling the intermediate 4-A to be subjected to oxidation reaction to obtain an intermediate 5, and enabling the intermediate 5 to react with a cyclic compound forming $Y^9$ and $Y^{10}$ to obtain the dibenzoheterocyclic compound shown in the formula (I);

$X_1$-$X_3$ are, each independently, selected from halogen; $X_4$ is oxygen; and $R_1$-$R_8$ are, each independently, selected from halogen or hydrogen;

a synthesis route of the dibenzoheterocyclic compound shown in the formula (I) is as follows:

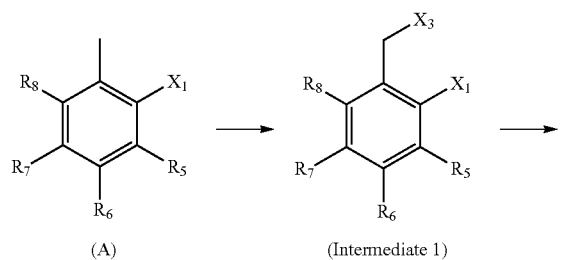

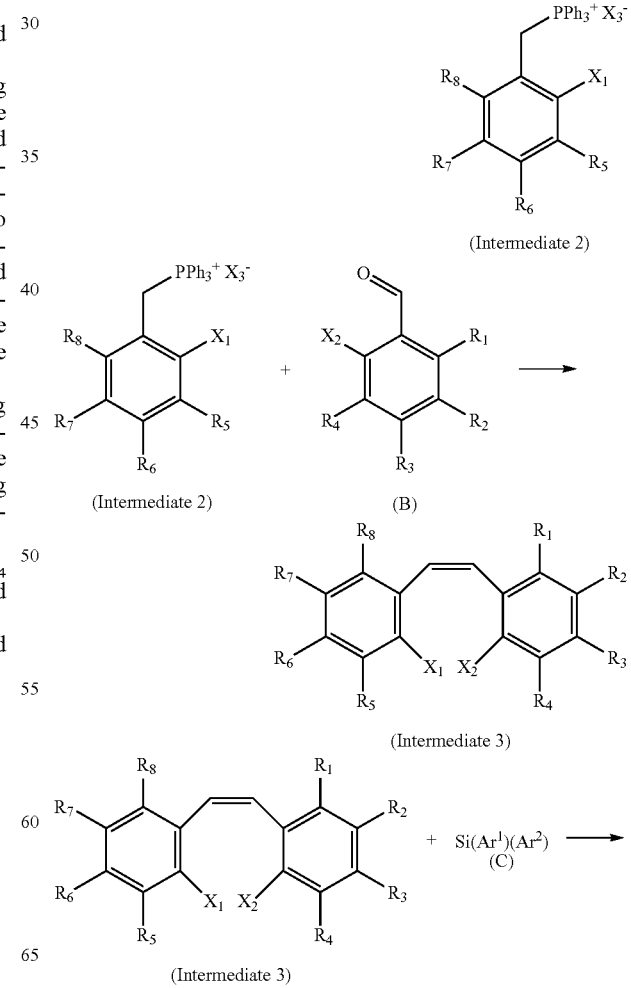

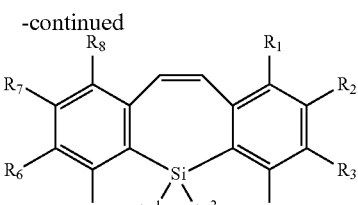

(Intermediate 4)

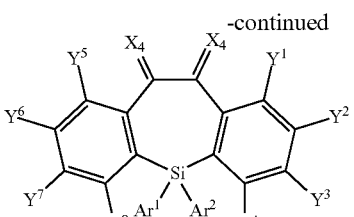

(Intermediate 5)

At least one of $Y^9$-$Y^{10}$, or a cyclic compound forming $Y^9$-$Y^{10}$ →

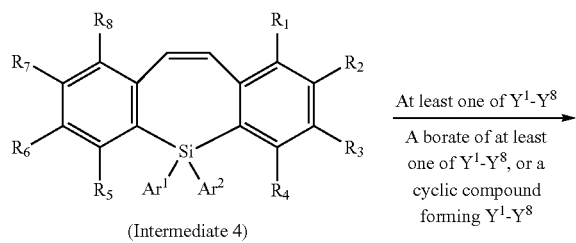

(Intermediate 4)

At least one of $Y^1$-$Y^8$
A borate of at least one of $Y^1$-$Y^8$, or a cyclic compound forming $Y^1$-$Y^8$
→

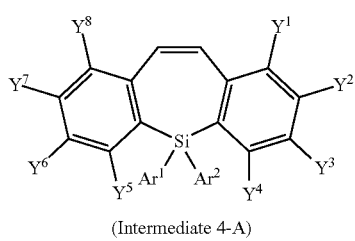

(Intermediate 4-A)

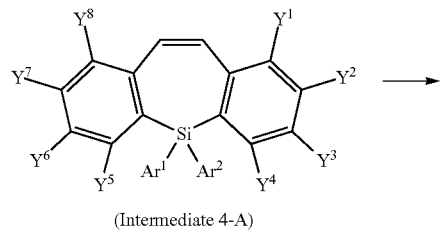

(Intermediate 4-A)

(I)

4. The dibenzoheterocyclic compound according to claim 1, wherein the dibenzoheterocyclic compound is an organic electroluminescent material.

5. An organic light emitting diode, wherein at least one functional layer of the organic light emitting diode contains the dibenzoheterocyclic compound according to claim 1.

6. The organic light emitting diode according to claim 5, wherein the functional layer is a light-emitting layer.

7. The organic light emitting diode according to claim 5, wherein a light-emitting layer material comprises a host material and a guest light-emitting material, and the guest light-emitting material is the dibenzoheterocyclic compound.

8. The organic light emitting diode according to claim 5, wherein a light-emitting layer material comprises a host material and a guest light-emitting dye, and the host material is the dibenzoheterocyclic compound.

9. The organic light emitting diode according to claim 5, wherein the organic light emitting diode is a blue light-emitting device.

10. A display unit, comprising the organic light emitting diode according to claim 5.

* * * * *